United States Patent
Inazuru et al.

(10) Patent No.: US 7,668,297 B2
(45) Date of Patent: Feb. 23, 2010

(54) X-RAY TUBE AND NONDESTRUCTIVE INSPECTION EQUIPMENT

(75) Inventors: Tutomu Inazuru, Shizuoka (JP); Tomoyuki Okada, Shizuoka (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 4 days.

(21) Appl. No.: 12/088,049

(22) PCT Filed: Oct. 3, 2006

(86) PCT No.: PCT/JP2006/319762

§ 371 (c)(1),
(2), (4) Date: Mar. 25, 2008

(87) PCT Pub. No.: WO2007/043390

PCT Pub. Date: Apr. 19, 2007

(65) Prior Publication Data

US 2009/0052626 A1    Feb. 26, 2009

(30) Foreign Application Priority Data

Oct. 7, 2005  (JP) ............... 2005-295697
Mar. 29, 2006  (JP) ............... 2006-091070

(51) Int. Cl.
*H01J 5/18* (2006.01)
*H01J 35/00* (2006.01)

(52) U.S. Cl. .................... 378/140; 378/121
(58) Field of Classification Search ........... 378/119, 378/140, 121, 124, 136, 137, 143
See application file for complete search history.

(56) References Cited

U.S. PATENT DOCUMENTS 5,077,771 A    12/1991  Skillicorn et al.
6,490,341 B1 *  12/2002  Ochiai et al. ............ 378/140
7,298,826 B2   11/2007  Inazuru

FOREIGN PATENT DOCUMENTS

CN        1393205        1/2003
JP        2-1600         1/1990
JP        2004-111336    4/2004

* cited by examiner

*Primary Examiner*—Irakli Kiknadze
(74) *Attorney, Agent, or Firm*—Drinker Biddle & Reath LLP

(57) ABSTRACT

In an X-ray tube 1A that makes electrons emitted from an electron gun 17 into a target 9 of an anode 8 arranged in a tubular vacuum enclosure body 6, and extracts the X-rays through an X-ray exit window 18, the anode 8 is arranged on a tube axis C1 of the vacuum enclosure body 6, and in a sealing portion 5g provided at an end portion of the vacuum enclosure body 6, provided is the X-ray exit window 18 eccentric with respect to the tube axis C1 of the vacuum enclosure body 6.

7 Claims, 17 Drawing Sheets

(A)

(B)

(C)

(A)

(B)

(A)

(B)

(A)

(B)

(C)

(A)

(B)

X-RAY TUBE AND NONDESTRUCTIVE INSPECTION EQUIPMENT

TECHNICAL FIELD

The present invention relates to an X-ray tube and a nondestructive inspection system that extract X-rays through an X-ray exit window.

BACKGROUND ART

X-rays are electromagnetic waves excellent in transmittance through an object and are often used for a nondestructive and noncontact observation of the internal structure of an object. An X-ray tube usually makes electrons that have been emitted from an electron gun incident into a target to generate X-rays. For the X-ray tube, as described in Patent Document 1, an electron gun is attached to a tubular member that houses a target to be an anode. Electrons emitted from the electron gun are made incident into the target, and X-rays are generated from the target. The X-rays are transmitted through an X-ray exit window provided on a tube axis of the tubular member housing the target and are irradiated onto an external sample. The X-rays transmitted through the sample are taken as an enlarged perspective image by various X-ray imaging devices.

Patent Document 1: Specification of U.S. Pat. No. 5,077,771

DISCLOSURE OF THE INVENTION

Problem to be Solved by the Invention

Meanwhile, a nondestructive inspection using an enlarged perspective image of X-rays is effective as a method for checking a joint state of components mounted on various electronic circuit boards. And, due to miniaturization of the circuit boards, components mounted thereon have increased in density, and it has thus been demanded to take enlarged perspective images with higher magnification ratios. Moreover, for checking a joint state of a solder ball mounted on such a circuit board, an enlarged perspective image that has been taken from a position tilted at a predetermined angle with respect to the solder ball is more suitable since this allows observing the solder ball three-dimensionally. Such an image can be obtained by imaging the circuit board being tilted relative to the X-ray tube or by imaging with the X-ray imaging device being displaced from directly above the X-ray tube, and the latter is more suitable to increase the magnification ratio of the enlarged perspective image.

However, for imaging with the X-ray imaging device displaced from directly above the X-ray tube, the irradiation angle of X-rays irradiated from the X-ray tube must be increased, and for increasing the irradiation angle of X-rays in a conventional X-ray tube, it is necessary to increase the diameter of the X-ray exit window, and when the diameter of the X-ray exit window is increased, excessive X-rays are irradiated from the X-ray tube. Then, equipment to prevent leakage of unnecessary X-rays further becomes necessary to easily lead to an increase in cost.

It is an object of the present invention to provide an X-ray tube and a nondestructive inspection system that can increase the magnification ratio of an enlarged perspective image obtained by irradiating X-rays from an oblique direction onto a sample and prevent leakage of unnecessary X-rays.

Means for Solving the Problem

In order to solve the above problem, an X-ray tube of the present invention includes: a tubular anode housing portion; an anode arranged in the anode housing portion; and an X-ray exit window through which X-rays are extracted, the X-rays being generated by making electrons emitted from an electron gun incident into a target of the anode; wherein the anode is arranged along a tube axis of the anode housing portion, and in a sealing portion provided at an end portion of the anode housing portion, provided is the X-ray exit window eccentric with respect to the tube axis of the anode housing portion.

In this X-ray tube, X-rays are extracted through the X-ray exit window provided eccentric with respect to the tube axis of the anode housing portion. Therefore, even if a circuit board or the like to serve as a sample is not tilted, X-rays can be irradiated onto the sample from an oblique direction, and the magnification ratio of an enlarged perspective image of the sample taken from an oblique direction can be increased. Moreover, in this X-ray tube, since it suffices to optimize an oblique observation by an X-ray imaging device such as an X-ray camera by making the X-ray exit window eccentric with respect to the tube axis of the anode housing portion and make the X-ray exit window have a necessary and sufficient size for an oblique observation, the X-ray exit window can be small, and leakage of excessive X-rays can be prevented. Further, when the X-ray exit window is reduced in size, the need for increasing the strength of the X-ray exit window is reduced so that the X-ray exit window can be thinned, and X-ray transmission efficiency can be improved to make it possible to take a clear enlarged perspective image. Further, when the X-ray exit window is small and thin, the rate of contamination from foreign matter in a window material of the X-ray exit window is lowered, so that the yield is improved and the manufacturing cost can be reduced.

Moreover, it is preferable that the electron gun is attached to a peripheral wall provided around the tube axis of the anode housing portion, and the X-ray exit window is eccentric to the electron gun side with respect to the tube axis. When the X-ray exit window is thus made eccentric to the electron gun side, X-rays of a large exposure dose can be extracted through the X-ray exit window, so that a clear enlarged perspective image can be easily taken.

Moreover, it is preferable that the X-ray exit window is provided in plurality in the sealing portion. Providing a plurality of X-ray exit windows makes it possible to take enlarged perspective images of a sample from a plurality of different oblique directions, so that when an inspection of the sample is performed, it becomes possible to take an enlarged perspective image from a more preferable direction.

Moreover, it is preferable that the electron gun is housed in a tubular electron gun housing portion fixed to the anode housing portion, a tube axis of the electron gun housing portion is orthogonal to the tube axis of the anode housing portion, and the X-ray exit window has a center at a position off a plane containing the tube axis of the anode housing portion and the tube axis of the electron gun housing portion. When the center of the X-ray exit window thus exists at a position off the plane containing the tube axis of the anode housing portion and the tube axis of the electron gun housing portion, even if, for example, a circuit board to serve as a sample is tilted so as to move close to the X-ray exit window, the electron gun housing portion hardly causes an obstruction. Therefore, the circuit board to serve as a sample can be easily moved close to the X-ray exit window, so that it becomes easy to improve the magnification ratio of an enlarged perspective image.

Moreover, it is preferable that the electron gun is housed in a tubular electron gun housing portion fixed to the anode housing portion, the tube axis of the electron gun housing portion and the tube axis of the anode housing portion cross each other, and an included angle formed by the tube axis of the electron gun housing portion and the tube axis of the anode housing portion is an acute angle, and the X-ray exit window has a center on a plane containing the tube axis of the anode housing portion and the tube axis of the electron gun housing portion. When the included angle between the tube axis of the anode housing portion and the tube axis of the electron gun housing portion is thus made an acute angle, even if, for example, a circuit board to serve as a sample is tilted so as to move close to the X-ray exit window, the electron gun housing portion is tilted with respect to the anode housing portion and thus hardly causes an obstruction. Therefore, the circuit board to serve as a sample can be easily moved close to the X-ray exit window, so that it becomes easy to improve the magnification ratio of an enlarged perspective image.

Moreover, it is preferable that, in the sealing portion, provided is the X-ray exit window provided eccentric with respect to the tube axis of the anode housing portion and a central X-ray exit window having a center on the tube axis of the anode housing portion. This makes it possible, besides imaging a sample from an oblique direction, to image the sample from directly above through the central X-ray exit window. And, it also becomes easy to apply the invention to such an inspection method for imaging only a sample for which it is inferred that a re-inspection is necessary based on an enlarged perspective image taken from directly above, and thus the variation of the inspection method is increased, so that a more effective inspection method can be selected.

Moreover, a nondestructive inspection system of the present invention includes: an X-ray tube that makes electrons emitted from an electron gun incident into a target of an anode arranged in a tubular anode housing portion to generate X-rays, and extracts the X-rays through an X-ray exit window; and an X-ray imaging device that images the X-rays extracted from the X-ray tube and transmitted through a sample, wherein the target is arranged on a tube axis of the anode housing portion, and in a sealing portion provided at an end portion of the anode housing portion, provided is the X-ray exit window eccentric with respect to the tube axis of the anode housing portion.

In this nondestructive inspection system, X-rays are extracted through the X-ray exit window provided eccentric with respect to the tube axis of the anode housing portion, and the X-rays transmitted through the sample are imaged by the X-ray imaging device. Therefore, even if a circuit board or the like to serve as a sample is not tilted, X-rays can be irradiated onto the sample from an oblique direction, and the magnification ratio of an enlarged perspective image of the sample taken from an oblique direction can be increased. Moreover, in this nondestructive inspection system, since the irradiation angle of X-rays is increased by making the X-ray exit window eccentric with respect to the tube axis of the anode housing portion, the X-ray exit window can be small, and leakage of excessive X-rays when imaging the sample from an oblique direction can be prevented. Further, when the X-ray exit window is reduced in size, the need for reinforcing the strength of the X-ray exit window is reduced so that the X-ray exit window can be thinned, and X-ray transmission efficiency can be improved to make it possible to take a clear enlarged perspective image. Further, when the X-ray exit window is small and thin, the rate of contamination from foreign matter in a window material of the X-ray exit window is lowered, so that the yield is improved and the manufacturing cost can be reduced.

EFFECTS OF THE INVENTION

The magnification ratio of an enlarged perspective image obtained by irradiating X-rays from an oblique direction onto a sample can be increased and leakage of unnecessary X-rays can be prevented.

Figure 1:
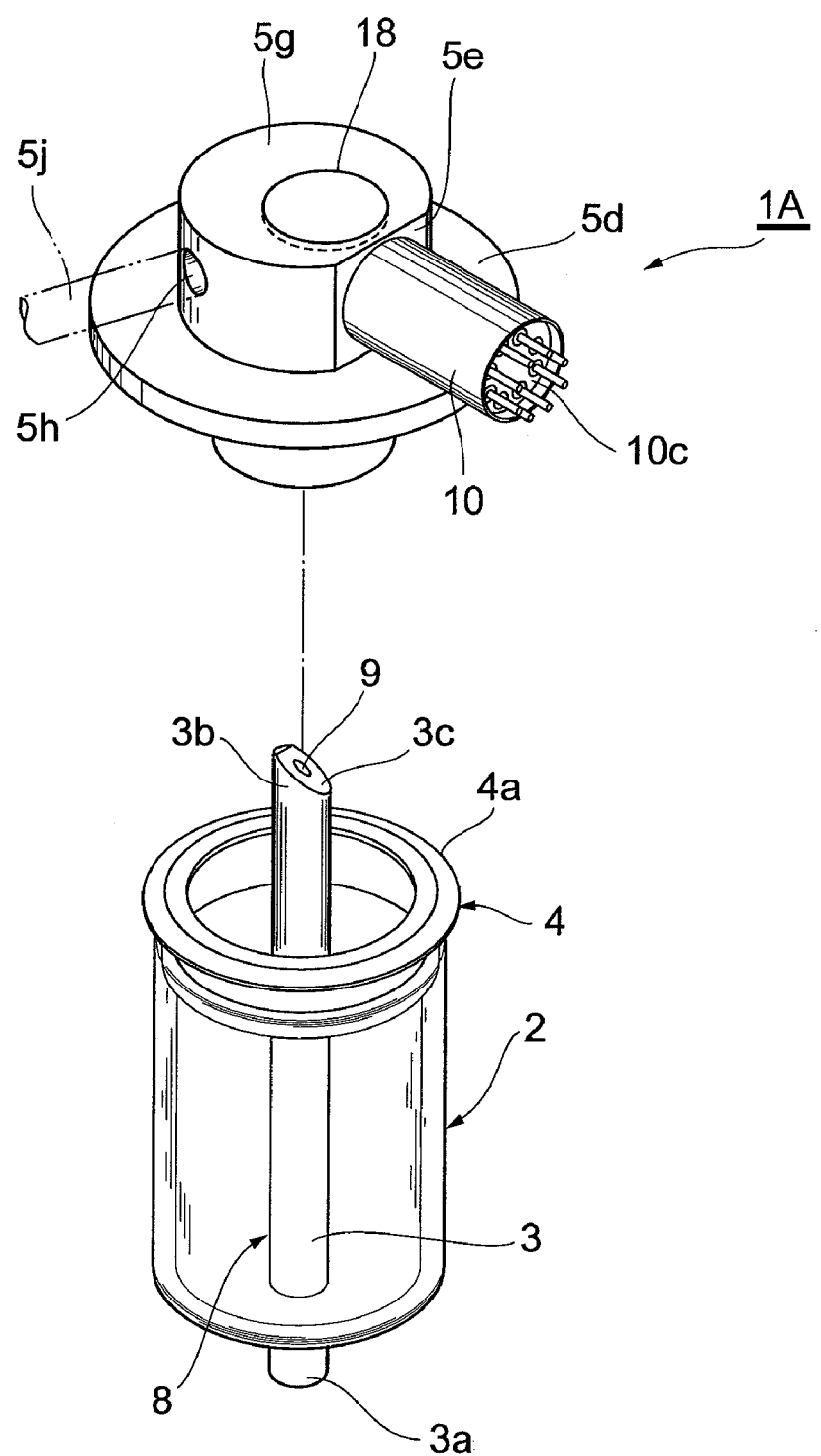
FIG. 1 is an exploded perspective view showing a first embodiment of an X-ray tube according to the present invention.
Figure 2:
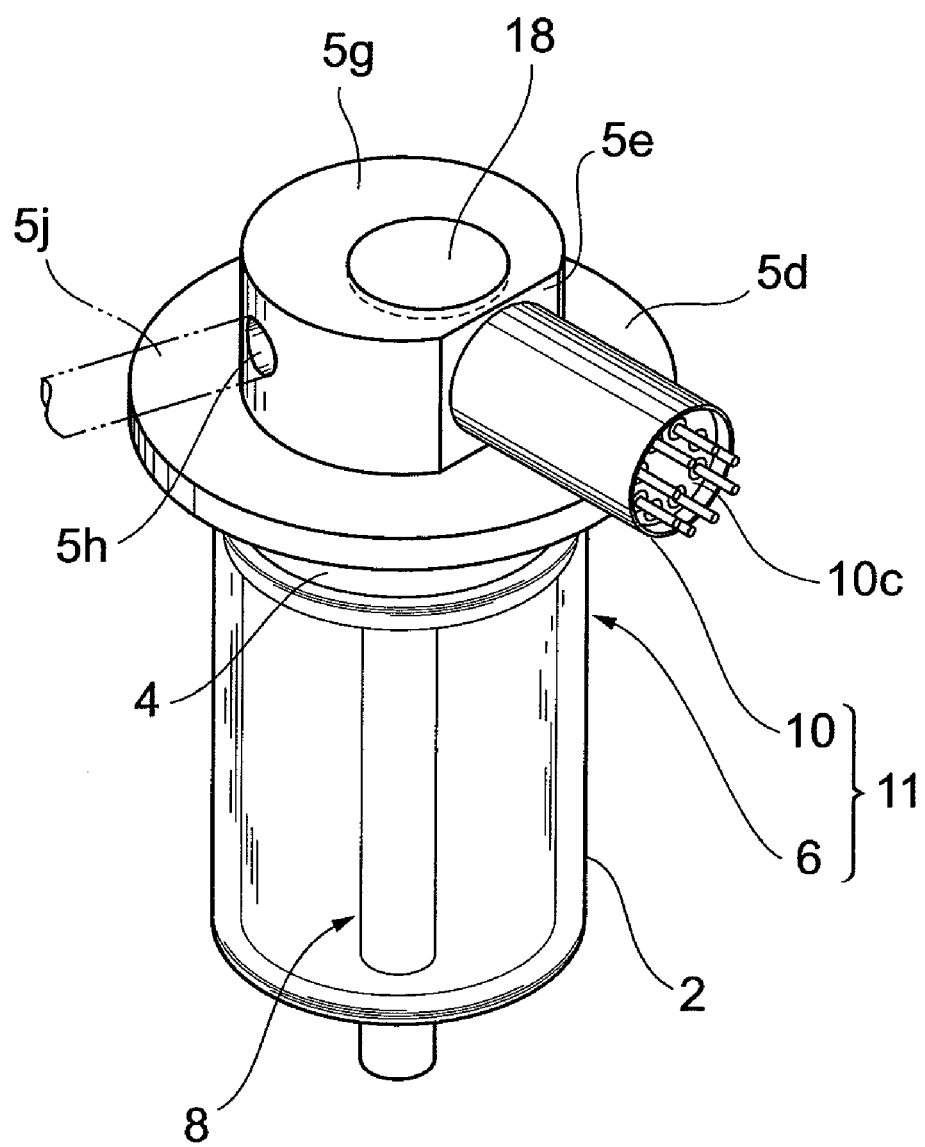
FIG. 2 is a perspective view of the X-ray tube according to the first embodiment.

DESCRIPTION OF THE REFERENCE NUMERALS 1, 1A-1I . . . X-ray tube; 2 . . . Valve; 5, 31 . . . Head portion; 5e . . . Plane portion; 5g, 31a . . . Sealing portion; 6, 30 . . . Vacuum enclosure body; 8 . . . Anode; 9 . . . Target; 10, 33 . . . Electron gun housing portion; 17 . . . Electron gun; 18, 29, 32, 35, 36, 41-44, 50, 210 . . . X-ray exit window; 19 . . . Nondestructive inspection system; 20 . . . X-ray camera; 45-47 . . . Central X-ray exit window; C1, C2, C4, C5 . . . Tube axis; θ . . . Included angle; A1, A3 . . . Reference plane.

BEST MODES FOR CARRYING OUT THE INVENTION

Hereinafter, embodiments of an X-ray tube according to the present invention will be described with reference to the drawings.

First Embodiment

As shown in FIG. 1 to FIG. 4, an X-ray tube 1A according to a first embodiment is a hermetically-sealed X-ray tube. The X-ray tube 1A has a roughly circular cylindrical valve 2. One end in a tube axis C1 direction of the valve 2 is reduced in diameter so as to close an opening, and a base-end portion 3a of a columnar copper anode body portion 3 extended onto the tube axis C1 is fixed to one end of the valve 2 with its part exposed from the valve 2. A metallic ring member 4 is fusion-bonded to the other end of the valve 2. In the following, description will be given while assuming one end side in the tube axis C1 direction of the valve 2 as "lower side," and the other end side, as "upper side."

A flange 4a is formed at the upper end of the ring member 4, and the flange 4a is welded in contact with the lower end of a roughly circular cylindrical head portion 5. The head portion 5 is made of stainless steel, and at the lower end of the head portion 5, provided is an annular flat portion 5a to which the flange 4a of the ring member 4 is welded. Inside of the flat portion 5a, an annular convex portion 5b to be fitted with the ring member 4 is provided, and inside of the convex portion 5b, a circular cylindrical portion 5c to be inserted into the valve 2 is provided. When the ring member 4 is welded to the head portion 5 so that the valve 2 is fixed to the head portion 5, a tubular vacuum enclosure body 6 having the common tube axis C1 is formed.

In the interior of the head portion 5, a front-end portion 3b of the anode body portion 3 is provided. On this front-end portion 3b, in a manner facing the side of an electron gun 17 to be described later, formed is a slanted surface 3c for which the anode body portion 3 is obliquely cut. In the slanted surface 3c, a disk-shaped target 9 made of tungsten is embedded. An electron incident surface of the target 9 is almost parallel to the slanted surface 3c. An anode 8 composed of the anode body 3 and the target 9 is housed in the vacuum enclosure body 6 serving as an anode housing portion.

A peripheral wall is provided on the head portion 5 around the tube axis C1, and a flange portion 5d is provided at this peripheral wall. In the peripheral wall, at an upper-end side further than the flange portion 5d, formed is a plane portion 5e extending in the tube axis C1 direction, and a circular through-hole 5f is formed in the plane portion 5e. To the plane portion 5e, one end portion of a tubular electron gun housing portion 10 is welded. In this end portion, provided is a circular cylindrical fitting portion 10a that is reduced in diameter and protruded. This fitting portion 10a is fitted into the through-hole 5f of the head portion 5, so that the electron gun housing portion 10 is positioned in the head portion 5. At the front end of the fitting portion 10a on the side of the anode 8 in the head portion 5, a circular aperture 10b is formed. The aperture 10b has a center on a tube axis C2 of the electron gun housing portion 10, and the tube axis C2 of the electron gun housing portion 10 is orthogonal to the tube axis C1 of the vacuum enclosure body 6. The electron gun housing portion 10 is welded to the head portion 5 of the vacuum enclosure body 6, and the vacuum enclosure body 6 and the electron gun housing portion 10 compose a vacuum enclosure 11. In the peripheral wall of the head portion 5, formed is an exhaust hole 5h to form a vacuum in the vacuum enclosure 11, and an exhaust tube 5j is inserted in the exhaust hole 5h and fixed to the peripheral wall.

In a manner closing an opening provided at the other end portion of the electron gun housing portion 10, a stem substrate 10c is fixed to the electron gun housing portion 10. A plurality of stem pins 12 are fixed to the stem substrate 10c. In the electron gun housing portion 10, an electron gun 17 is fixed to the stem pins 12 so as to be capable of supplying electricity. More specifically, the electron gun 17 is fixed to the electron gun housing portion 10 via the stem pins 12, and the electron gun housing portion 10 is fixed to the peripheral wall of the head portion 5. Electrons are generated when a heater (not shown) of the electron gun 17 is heated, and the electrons are emitted through the aperture 10b into the head portion 5.

In the head portion 5, the target 9 of the anode 8 is arranged so as to be on the tube axis C1, and the slanted surface 3c in which the target 9 is embedded is arranged so as to be opposed to the aperture 10b, and thus the electrons emitted from the aperture 10b are made incident into the target 9, and X-rays are generated from the target 9.

Further, at an upper-end portion of the head portion 5, a sealing portion 5g is integrally molded. In this sealing portion 5g, a circular X-ray exit window 18 made of a Be-material is provided in such a manner as to face the electron incident surface of the target 9 and cross the tube axis C1. The thickness of the X-ray exit window 18 is approximately 0.15 mm. X-rays generated at the target 9 are transmitted through the X-ray exit window 18 and extracted to the outside.

Figure 3:
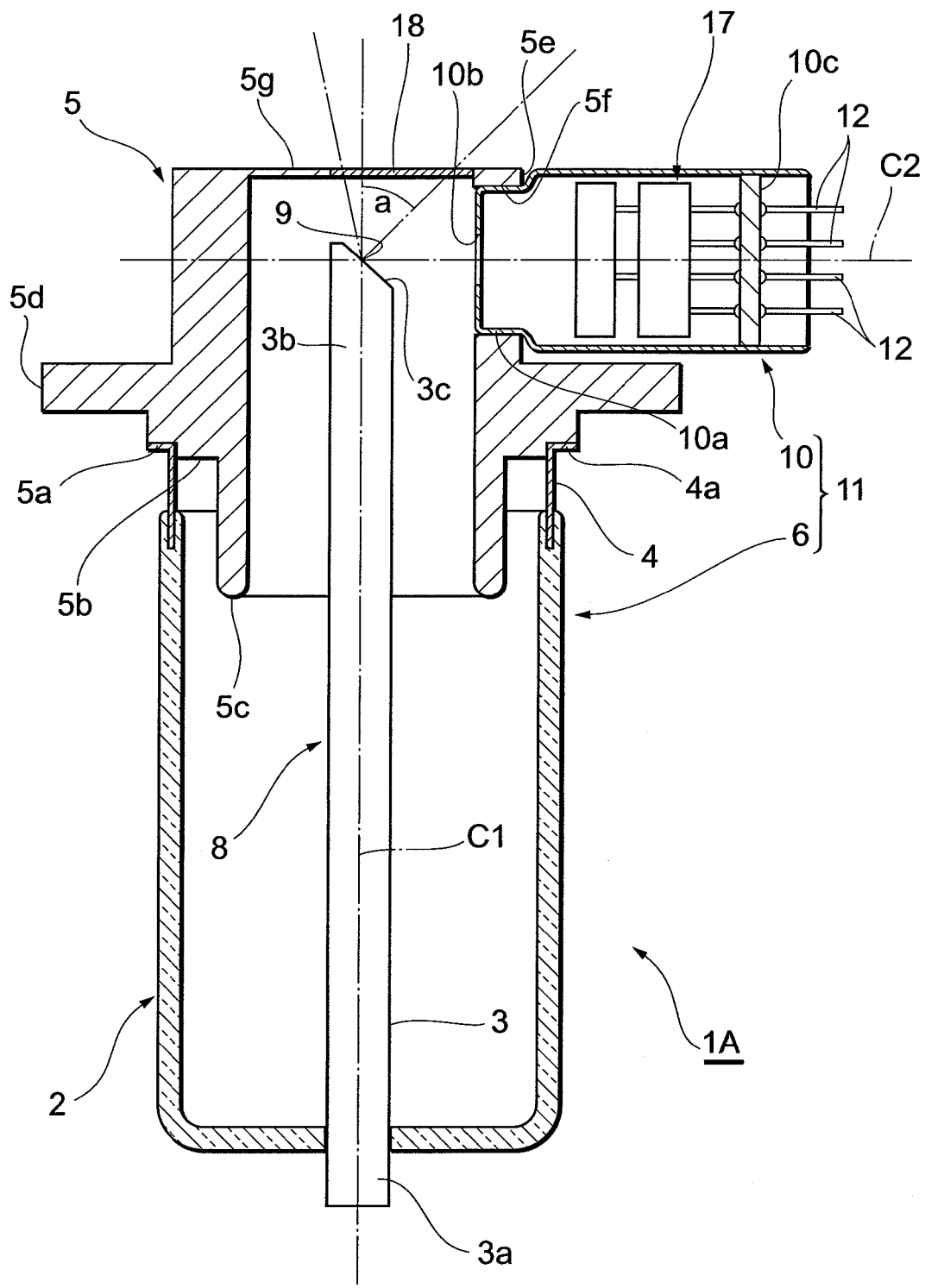
FIG. 3 is a sectional view of the X-ray tube according to the first embodiment.
Figure 4:
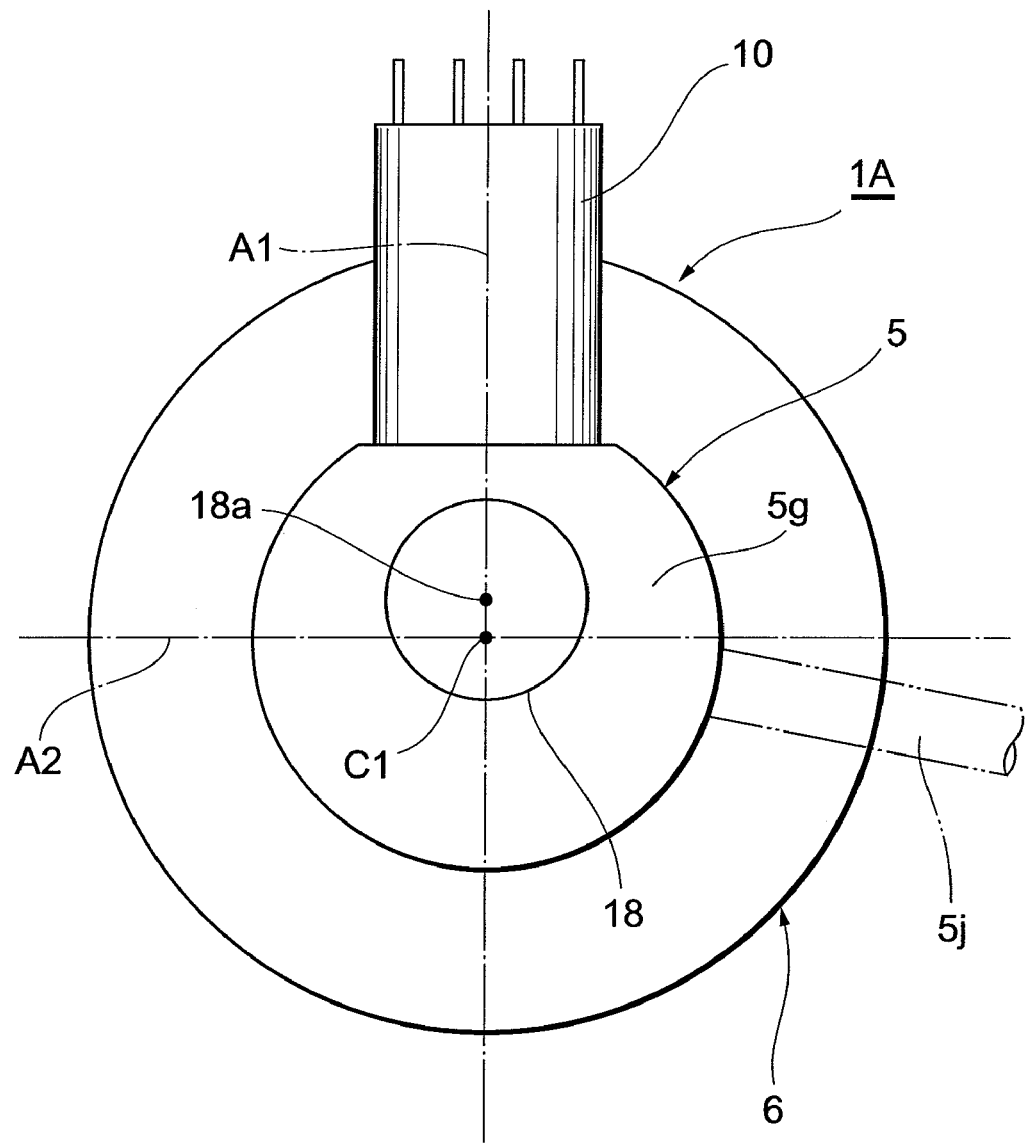
FIG. 4 is a plan view of the X-ray tube according to the first embodiment, observed from its X-ray tube exit window side.

As shown in FIG. 3 and FIG. 4, on a reference plane A1 containing the tube axis C1 of the vacuum enclosure body 6 and the tube axis C2 of the electron gun housing portion 10, a center 18a of the X-ray exit window 18 is arranged. In addition, the center 18a of the X-ray output window 18 is eccentric to the electron gun 17 side with respect to the tube axis C1. Here, "the electron gun side with respect to the tube axis" means that it is on the side of the electron gun 17 further than a plane A2 that passes through the tube axis C1 and is orthogonal to the reference plane A1.

Figure 5:
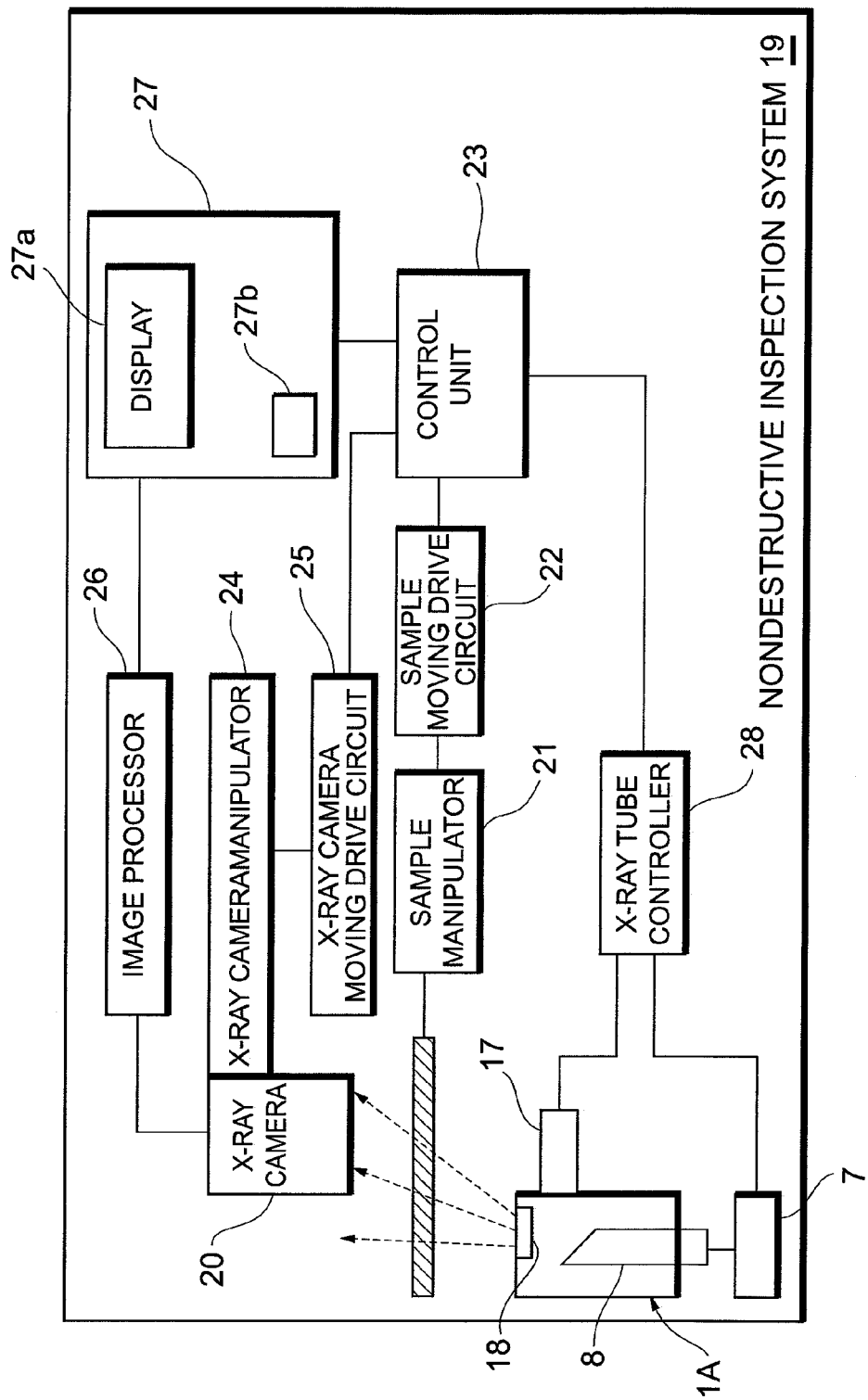
FIG. 5 is a block diagram showing a nondestructive inspection system incorporated with the X-ray tube according to the first embodiment.

Next, referring to FIG. 5, description will be given of a nondestructive inspection system 19 incorporated with the X-ray tube. The nondestructive inspection system 19 includes an X-ray camera 20, which is an X-ray imaging device. The X-ray imaging device may be an X-ray image intensifier, one having an X-ray scintillator and a pickup device (for example, a CCD camera) sensitive to scintillator light from said X-ray scintillator, or one using a semiconductor, such as CdTe (cadmium telluride) or amorphous selenium, that directly changes X-rays to an electric charge. Between this X-ray camera 20 and the X-ray exit window 18 of the X-ray tube 1A, arranged is a circuit board B to serve as a sample. The circuit board B is held by a sample manipulator 21 so as to be movable in the horizontal direction. The sample manipulator 21 is connected to a sample moving drive circuit 22. The sample moving drive circuit 22 is connected to a control unit 23 equipped with a CPU, a RAM, a ROM, and the like. The sample moving drive circuit 22 drive-controls the sample manipulator 21 according to an input signal from the control unit 23, to move the circuit board B to a position where X-rays emitted from the X-ray tube 1A can be transmitted therethrough.

The X-ray camera 20 is arranged separated by a predetermined distance with respect to the circuit board B, and follows a movement of the X-ray tube by means of an X-ray camera manipulator 24. The X-ray camera manipulator 24 is connected to an X-ray camera moving drive circuit 25. The X-ray camera moving drive circuit 25 is connected to the control unit 23. The X-ray camera drive circuit 25 drive-controls the X-ray camera manipulator 24 according to an input signal from the control unit 23, to move the X-ray camera 20 so as to reach a position where an enlarged perspective image of the circuit board B can be taken.

The X-ray camera 20 is connected with an image processor 26 that applies a predetermined image processing to X-rays transmitted through the circuit board B and outputs the same as a picture signal. This image processor 26 is connected to a monitoring device 27. The monitoring device 27 is provided with a display 27a that displays an enlarged perspective image of the circuit board B as an output from the X-ray camera 20.

Further, based on an operation of an operating unit 27b provided in the monitoring device 27, a signal that drives the sample manipulator 21 to move the circuit board B to a desired position is outputted to the control unit 23, and further, a signal that drives the X-ray camera manipulator 24 to make the X-ray camera 20 take an enlarged perspective image of the circuit board B at the desired position is outputted to the control unit 23.

The control unit 23 is connected to an X-ray tube controller 28. The X-ray tube controller 28 is connected to the electron gun 17 of the X-ray tube 1A. In addition, the X-ray tube controller 28 is also connected to a high-pressure power supply 7, and instructs the high-voltage power supply 7 to supply a predetermined voltage to the anode 8 of the X-ray tube 1A. The X-ray controller 28 thus controls X-rays generated in the X-ray tube 1A, based on a control signal from the control unit 23.

Next, description will be given of operations of the nondestructive inspection system 19. When the operating unit 27b is operated to start a nondestructive inspection, based on a control signal from the control unit 23, the X-ray camera manipulator 24 and the sample manipulator 21 are drive-controlled to move the X-ray camera 20 and the circuit board B to predetermined positions. In addition, before starting a nondestructive inspection, the X-ray tube controller 28 is activated in advance, based on a control signal from the control unit 23, to make preparation for operation of the X-ray tube 1A. Then, at the start of a nondestructive inspection, based on a control signal from the control unit 23, the X-ray tube controller 28 is activated, and electrons emitted from the electron gun 17 are properly made incident into the target 9, due to an electric field in the head portion 5, to generate X-rays. The X-rays are extracted through the X-ray exit window 18 and irradiated onto the circuit board B.

As shown in FIG. 3, the X-ray exit window 18 is eccentric to the electron gun 17 side with respect to the tube axis C1 of the vacuum enclosure body 6 on which the target 9 is arranged. Therefore, the X-rays extracted through the X-ray exit window 18 have a wide irradiation range at the electron gun 17 side. For example, an X-ray irradiation angle α at the electron gun 17 side is preferably within a range of 45° to 75°.

Figure 6:
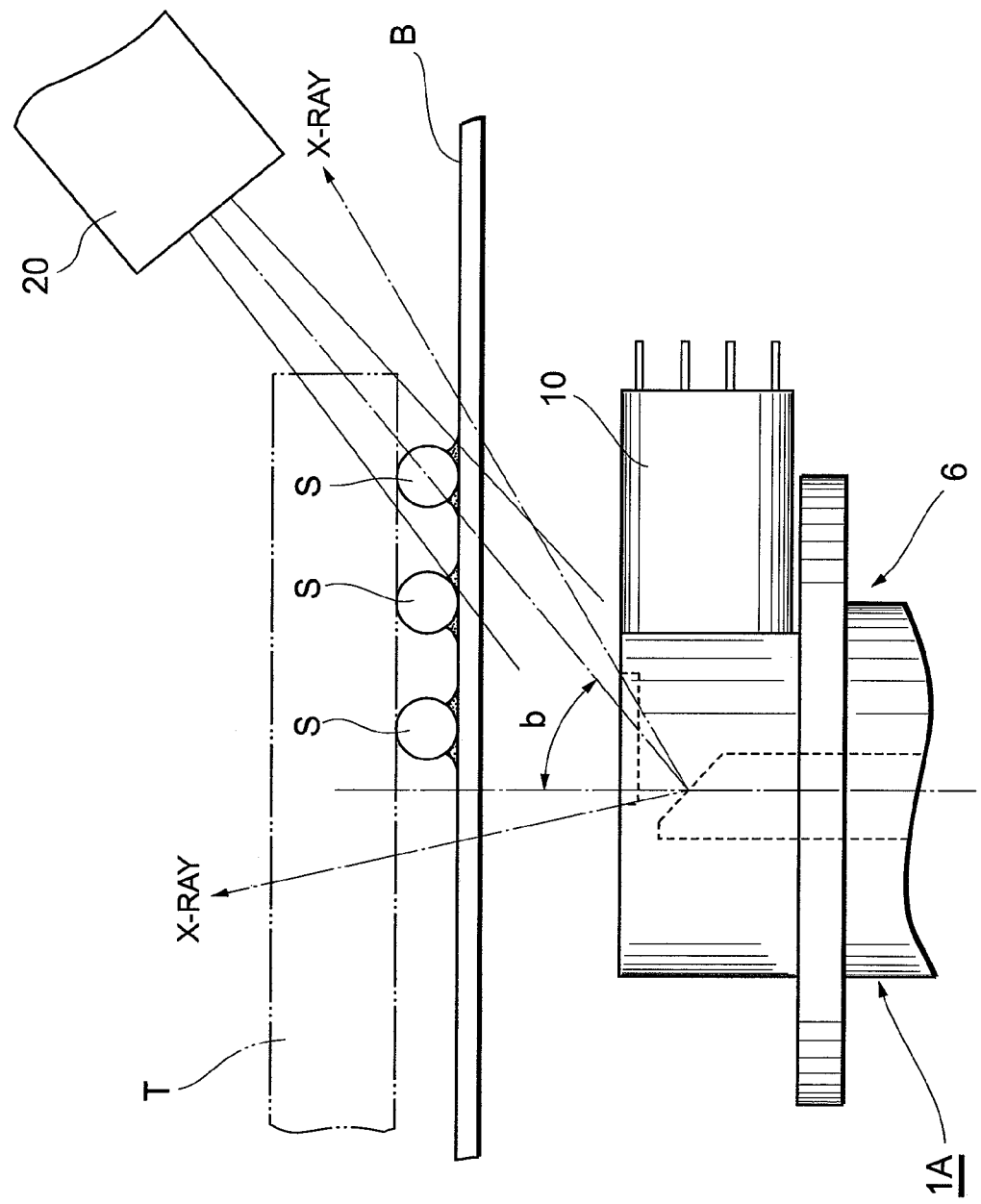
FIG. 6 is a view showing an arrangement relationship between an X-ray camera and an X-ray tube.

As shown in FIG. 6, it is generally known that a joint state of solder balls (BGA) S of an IC chip T mounted on the circuit board B can be checked more efficiently by observing from an oblique direction with the X-ray camera 20. For such an observation from an oblique direction, it is necessary to observe the solder balls S arrayed at equal intervals in perspective at such an angle that these do not overlap with each other. Therefore, when the circuit board B is arranged so as to be orthogonal to the tube axis C1 of the vacuum enclosure body 6, a suitable observation angle β is 45° to 75° in consideration of the intervals of the solder balls S.

Figure 7:
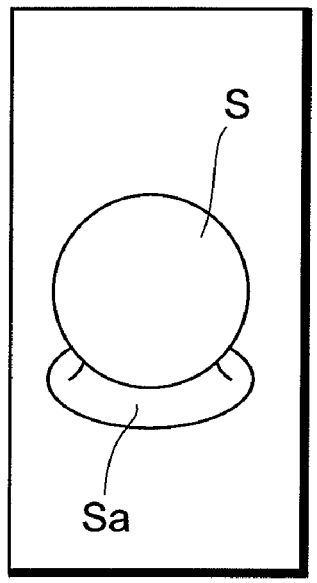
FIG. 7 show enlarged perspective views, wherein (A) and (B) show enlarged perspective images of an X-ray tube taken from obliquely above, and (C) is an enlarged perspective image of an X-ray tube taken from directly above.
Figure 7:
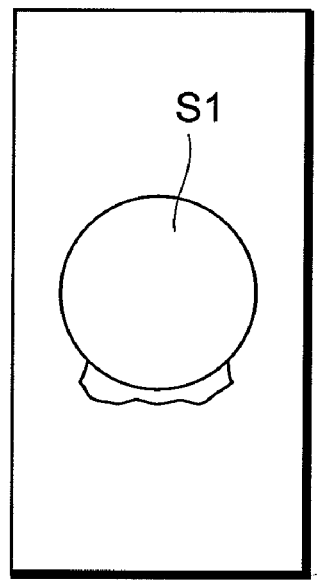
Figure 7:
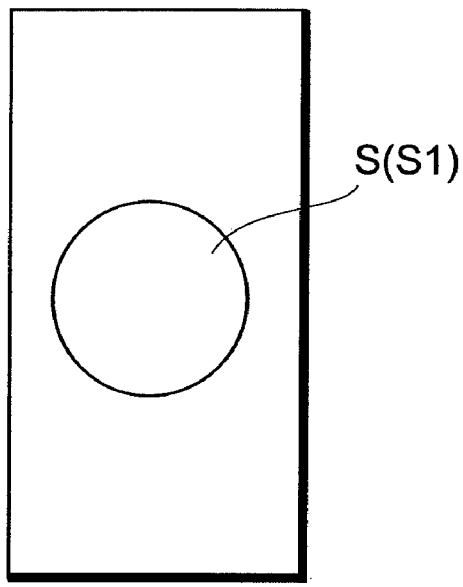

When the solder ball S is observed from an oblique direction by the X-ray camera 20, as shown in FIG. 7(A), the solder ball S is three-dimensionally displayed. In this case, a solder leak at a joint part Sa of the solder ball S is clearly shown by shading contrast. The solder ball S in FIG. 7(A) shows a normal state, the solder ball S1 in FIG. 7(B) shows a defective state. On the other hand, when, as shown in FIG. 7(C), the X-ray camera 20 is arranged on the tube axis C1 of the vacuum enclosure body 6, a joint part of the solder ball S. S1 is hardly visible as a result of being hidden behind the solder ball S, S1. Thus, an oblique observation by the X-ray camera 20 allows to reliably detect a solder leak so that inspection accuracy can be improved.

In the X-ray tube 1A according to the present embodiment, the X-ray exit window 18 eccentric with respect to the tube axis C1 of the vacuum enclosure body 6 is provided, and X-rays are extracted through X-ray exit window 18 with such an arrangement, and thus an oblique observation by the X-ray camera 20 can be easily performed. As a result, it becomes easy to move the circuit board B close to the X-ray exit window 18, so that the magnification ratio of an enlarged perspective image can be easily increased. Also, when, as conventionally done, the X-ray camera 20 is arranged above the tube axis C1, as mentioned above, it is necessary to tilt the circuit board B since a three-dimensional image cannot be obtained, however, in this case, it is difficult to move the circuit board B close to the X-ray exit window, so that it is difficult to increase the magnification ratio.

Further, in the X-ray tube 1A, since it suffices to optimize an oblique observation by the X-ray camera 20 by making the X-ray exit window 18 eccentric with respect to the tube axis C1 of the vacuum enclosure body 6 and make the X-ray exit window 18 have a necessary and sufficient size for an oblique observation, the X-ray exit window 18 can be small, and leakage of excessive X-rays can be prevented. Further, when the X-ray exit window 18 is reduced in size, the need for reinforcing the strength of the X-ray exit window 18 is reduced so that the X-ray exit window 18 can be thinned, and X-ray transmission efficiency can be improved to make it possible to take a clear enlarged perspective view. Further, when the X-ray exit window 18 is small and thin, the rate of contamination from foreign matter in a window material of the X-ray exit window is lowered, so that the yield is improved and the manufacturing cost can be reduced. Also, in the X-ray tube 1A, since the X-ray exit window 18 is arranged in a manner crossing the tube axis C1, besides imaging the circuit board B from an oblique direction, it is also possible to image the circuit board B from directly above by X-rays extracted through the X-ray exit window 18.

In addition, since the X-ray exit window 18 through which X-rays are extracted is eccentric to the electron gun 17 side, X-rays of a large exposure dose can be extracted through the X-ray exit window 18, so that a clear enlarged perspective image can be easily taken.

Second Embodiment

Figure 8:
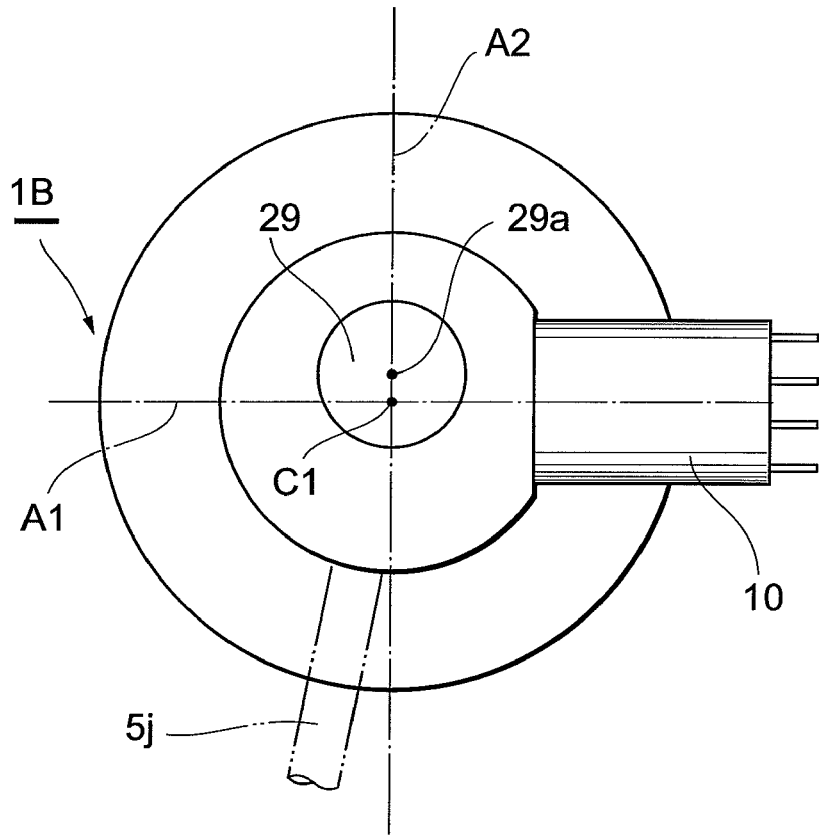
FIG. 8 show a second embodiment of an X-ray tube according to the present invention, wherein (A) is a plan view observed from its X-ray exit window side, and (B) is a back view observed from its electron gun side.
Figure 8:
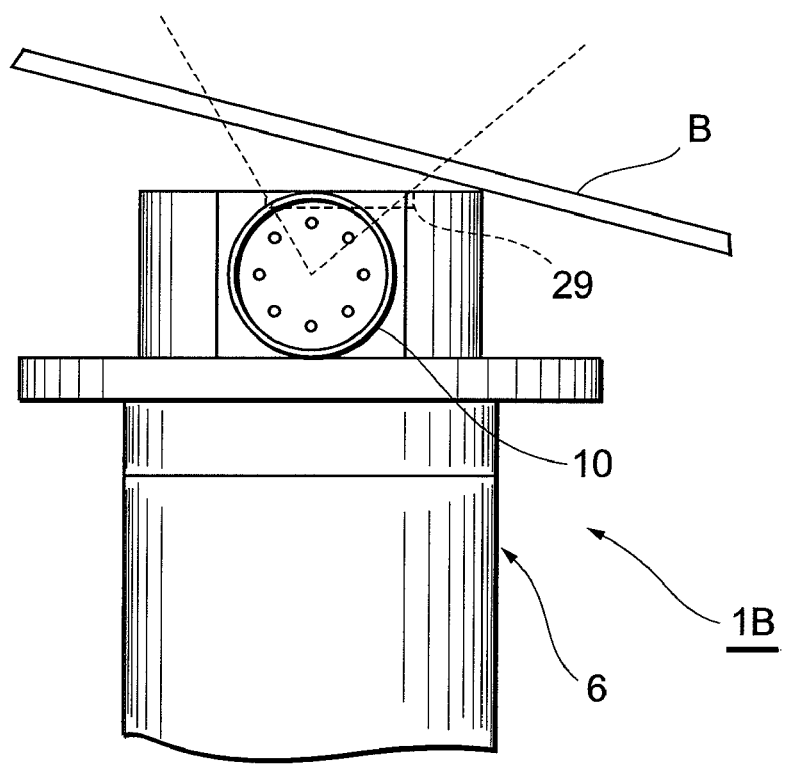

Referring to FIG. 8, description will be given of an X-ray tube 1B which is a second embodiment, and this X-ray tube 1B has a configuration suitable for tilting the circuit board B to obtain an enlarged three-dimensional image of the solder ball S. FIG. 8(A) is a plan view of the X-ray tube observed from its X-ray exit window side, and FIG. 8(B) is a side view of the X-ray tube observed from its electron gun side. Also, in the X-ray tube 1B according to the second embodiment, the same or equivalent structures to those of the X-ray tube 1A are denoted with the same reference numerals and a description thereof will thus be omitted.

As shown in FIG. 8(A), an X-ray exit window 29 has a circular shape and crosses the tube axis C1. Further, a center 29a of the X-ray exit window 29 is off to the side in a manner away from above the reference plane A1 and is arranged on the plane A2 that passes through the tube axis C1 and is orthogonal to the reference plane A1. When such an X-ray exit window 29 is provided, as shown in FIG. 8(B), the center 29a of the X-ray exit window 29 is away from the electron gun 17 side, so that, without the electron gun housing portion 10 causing an obstruction, the circuit board B can be tilted to move close to the X-ray exit window 29. As a result, the circuit board B can be moved closer to the X-ray exit window 29, so that the magnification ratio of an enlarged perspective image can be improved. Also, in the X-ray tube 1B, since the X-ray exit window 29 is arranged in a manner crossing the tube axis C1, besides imaging the circuit board B from an oblique direction, it is also possible to image the circuit board B from directly above by X-rays extracted through the X-ray exit window 29.

Third Embodiment

Figure 9:
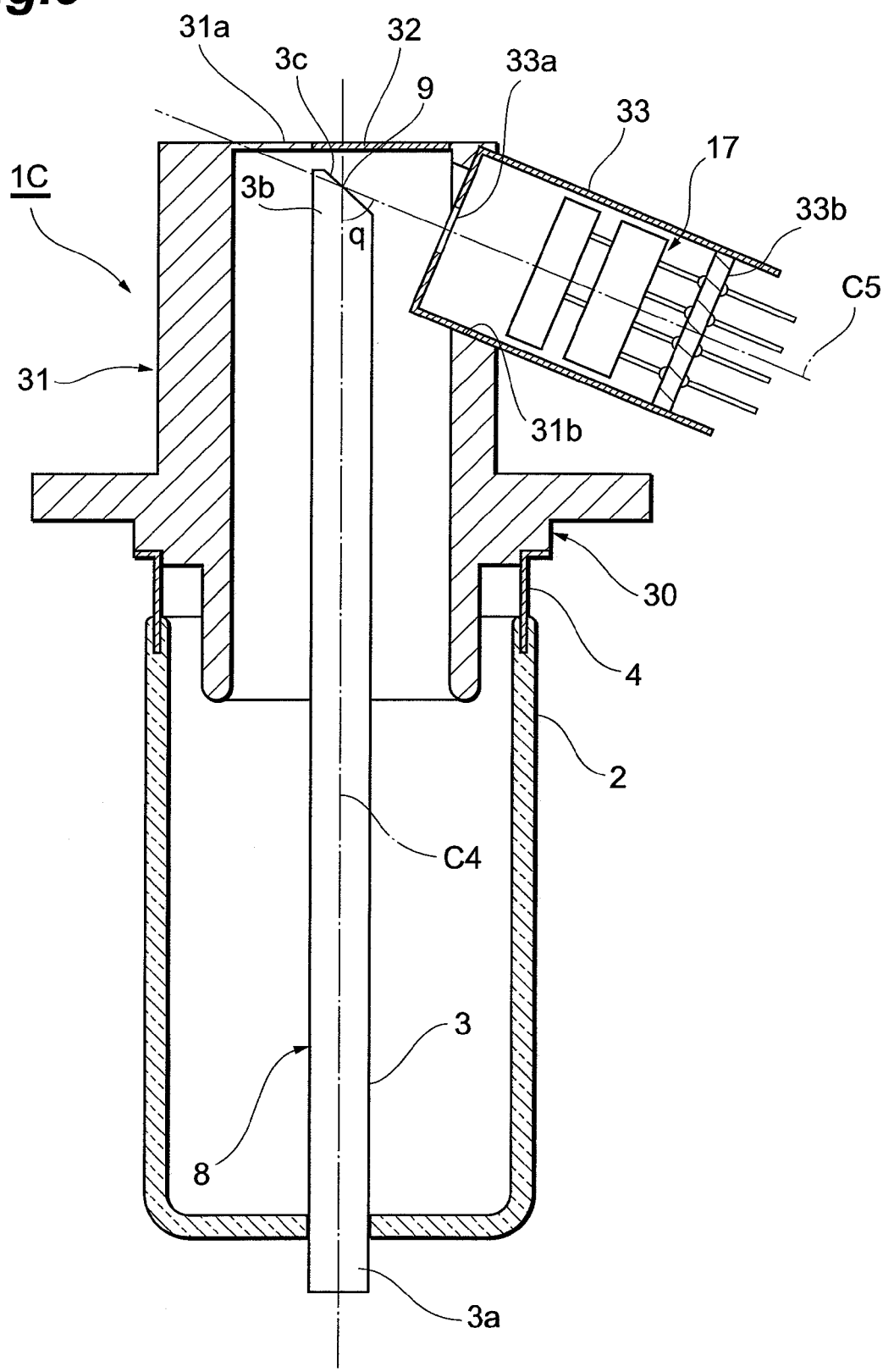
FIG. 9 is a sectional view showing a third embodiment of an X-ray tube according to the present invention.
Figure 10:
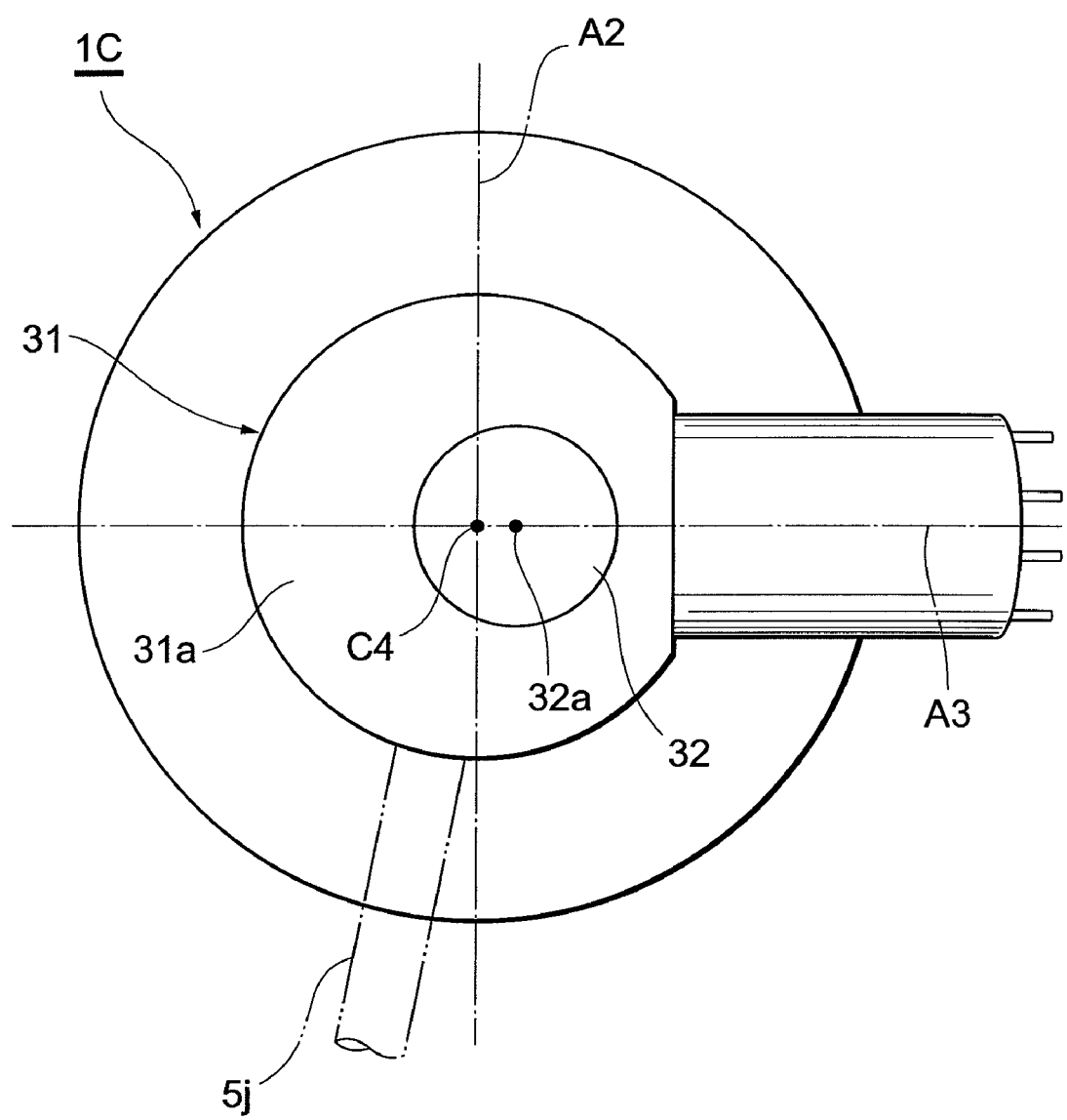
FIG. 10 is a plan view of the X-ray tube according to the third embodiment observed from its X-ray exit window side.
Figure 11:
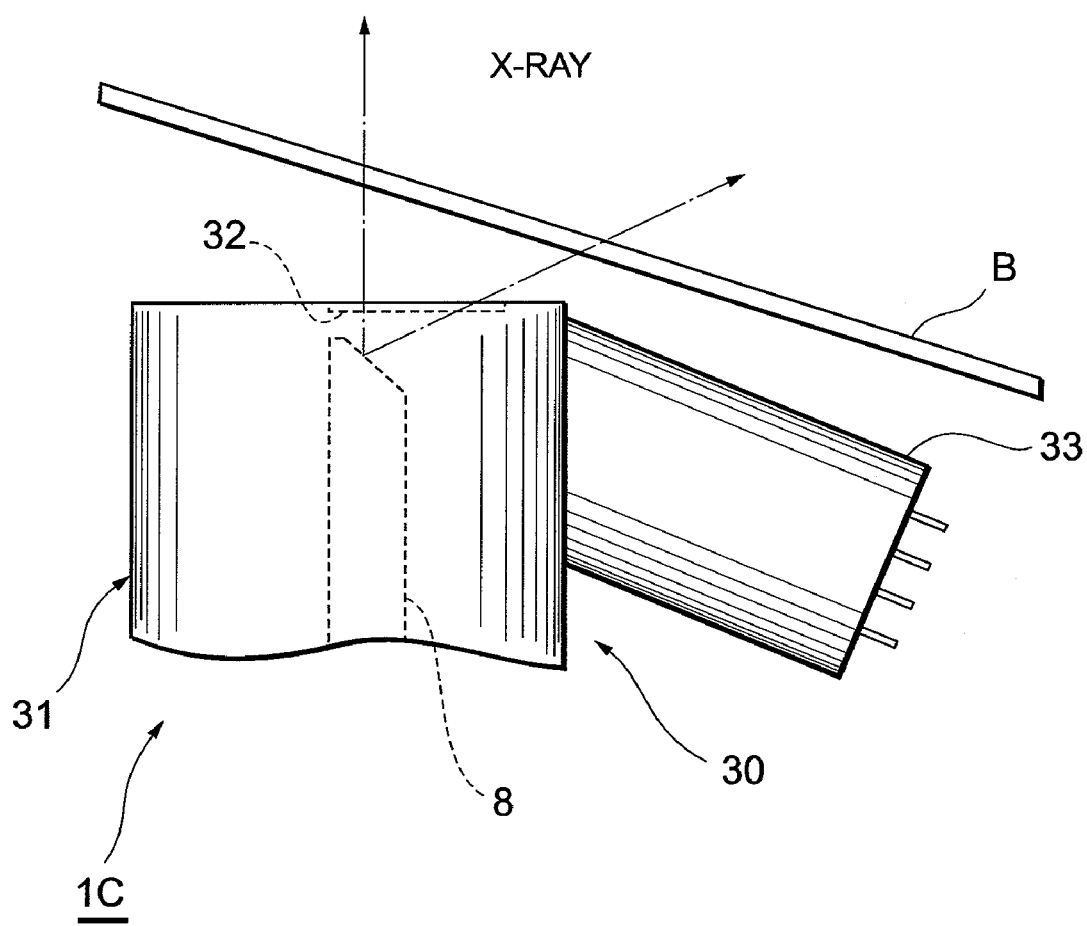
FIG. 11 is a side view showing the vicinity of an X-ray exit window side of the X-ray tube according to the third embodiment.

Referring to FIG. 9 to FIG. 11, description will be given of an X-ray tube 1C which is a third embodiment, and this X-ray tube 1C has a configuration suitable for tilting the circuit board B to obtain an enlarged three-dimensional image of the solder ball S. FIG. 9 is a sectional view of the X-ray tube, FIG. 10 is a plan view of the X-ray tube observed from its X-ray exit window side, and FIG. 11 is a side view showing the vicinity of an electron gun housing portion. Also, in the X-ray tube 1C according to the third embodiment, the same or equivalent structures to those of the X-ray tube 1A are denoted with the same reference numerals and a description thereof will thus be omitted.

A head portion 31 of a vacuum enclosure body 30 has a roughly circular cylindrical shape, and is fixed at its lower-end portion with the valve 2 via the ring member 4. The lower-end portion of the valve 2 holds the base-end portion 3a of the anode body portion 3. The front-end portion 3b of the anode body portion 3 is arranged in the head portion 31, and the target 9 is embedded in the slanted surface 3c formed on the front-end portion 3b.

A sealing portion 31a is integrally formed at an upper-end portion of the head portion 31, and in the sealing portion 31a, a circular X-ray exit window 32 is provided so as to cross a tube axis C4. As shown in FIG. 10, a center 32a of the X-ray exit window 32 is on a reference plane A3 containing the tube axis C4 of the vacuum enclosure body 30 and a tube axis C5 of the electron gun housing portion 10, and is provided eccentric to the electron gun 17 side with respect to the tube axis C4.

As shown in FIG. 9, in a peripheral wall of the head portion 31, formed is such a circular through-hole 31b that tilts obliquely downward from the inside to the outside. A tubular electron gun housing portion 33 is fitted in this through-hole 31b. The electron gun housing portion 33 is welded to the head portion 31. At the front end of the electron gun housing portion 33, a circular aperture 33a is formed. The aperture 33a has a center on the tube axis C5 of the electron gun housing portion 33. The tube axis C5 of the electron gun housing portion 33 crosses the tube axis C4 of the vacuum enclosure body 30. Thus, an included angle θ at the anode 8 side formed by the tube axis C5 of the electron gun housing portion 33 and the tube axis C4 of the vacuum enclosure body 30 has an acute angle (that is, an included angle (180°−θ) at the X-ray exit window 32 side has an obtuse angle), and a stem substrate 33b side of the electron gun housing portion 33 is released to the valve 2 side.

As in the X-ray tube 1C according to the present embodiment, when the included angle θ at the anode 8 side formed by the tube axis C5 of the electron gun housing portion 33 and the tube axis C4 of the vacuum enclosure body 30 has an acute angle, as shown in FIG. 11, even if the circuit board B is tilted to the electron gun housing portion 33 side so as to move close to the X-ray exit window 32, the electron gun housing portion 33 is tilted with respect to the vacuum enclosure body 30 and thus hardly causes an obstruction. As a result, the circuit board B can move closer to the X-ray exit window, so that the magnification ratio of an enlarged perspective image can be improved. Also, in the X-ray tube 1C, since the X-ray exit window 32 is arranged in a manner crossing the tube axis C4, besides imaging the circuit board B from an oblique direction, it is also possible to image the circuit board B from directly above by X-rays extracted through the X-ray exit window 32.

Figure 12:
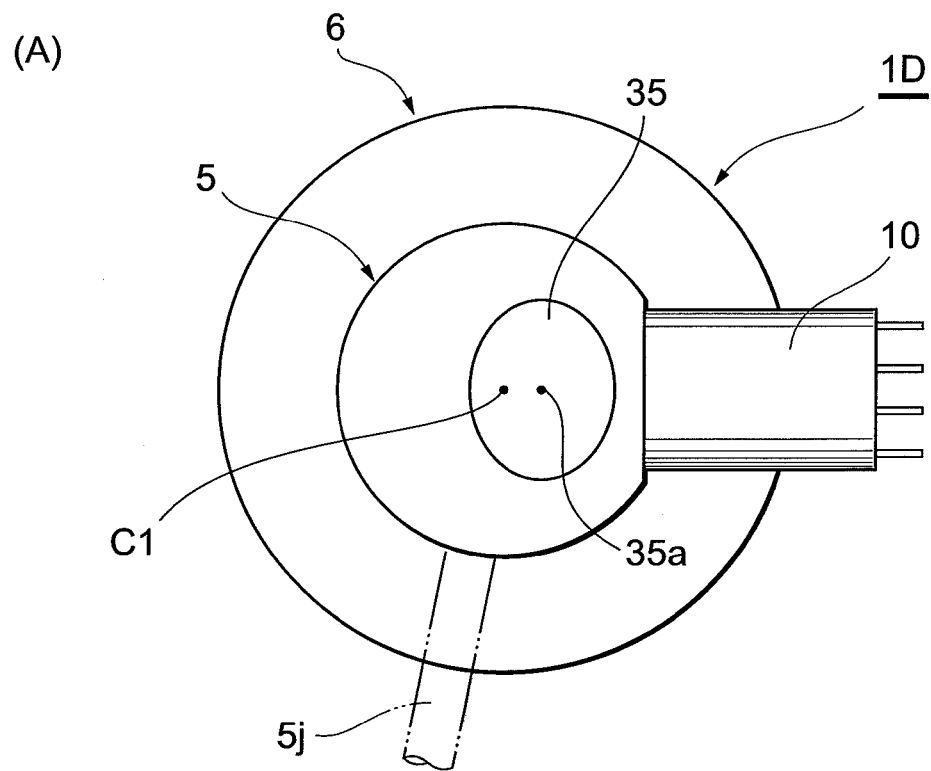
FIG. 12 show fourth and fifth embodiments of an X-ray tube according to the present invention, wherein (A) is a plan view of the X-ray tube according to the fourth embodiment observed from its X-ray exit window side, and (B) is a plan view of the X-ray tube according to the fifth embodiment observed from its X-ray exit window side.
Figure 12:
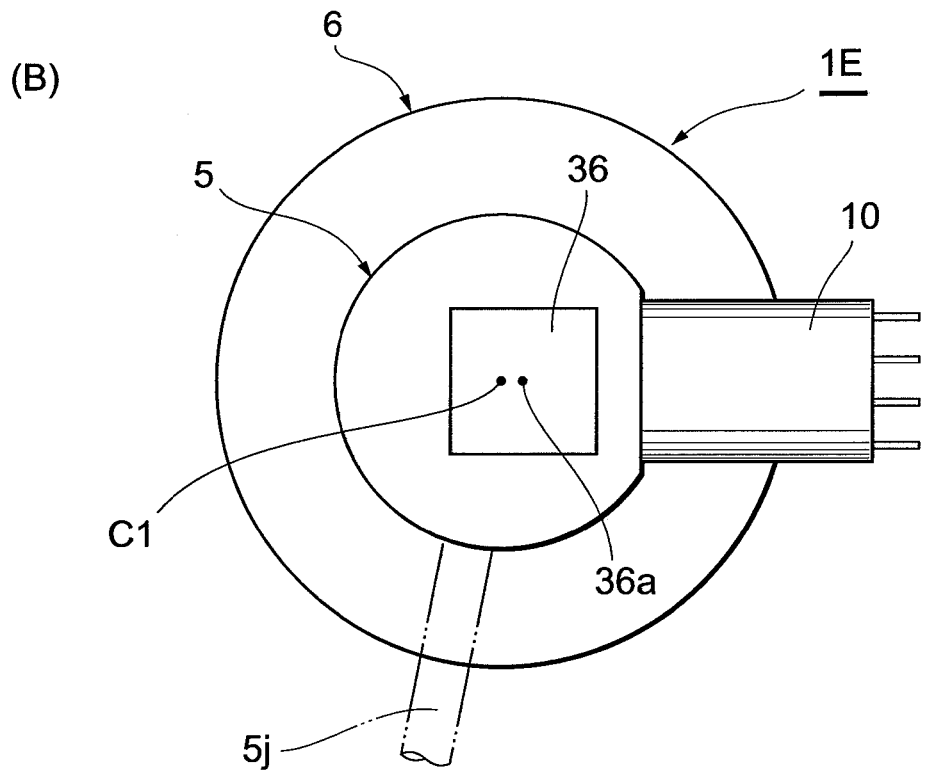

Referring to FIG. 12, description will be given of an X-ray tube 1D according to a fourth embodiment and an X-ray tube 1E according to a fifth embodiment. Also, in the X-ray tube 1D and the X-ray tube 1E, the same or equivalent structures to those of the X-ray tube 1A are denoted with the same reference numerals and a description thereof will thus be omitted.

Fourth Embodiment

In the X-ray tube 1D, unlike the X-ray tube 1A, the shape of an X-ray exit window 35 is elliptic, and a center 35a of the X-ray exit window 35 is eccentric to the side of the electron gun 17 housed in the electron gun housing portion 10. This X-ray tube 1D can also, like the X-ray tube 1A, take an enlarged perspective image by irradiating X-rays onto the circuit board B from an oblique direction, and can increase the magnification ratio of the enlarged perspective image. Also, the X-ray exit window 35 of the X-ray tube 1D crosses the tube axis C1, so that it is also possible to image the circuit board B from directly above.

Fifth Embodiment

In the X-ray tube 1E, unlike the X-ray tube 1A, the shape of an X-ray exit window 36 is rectangular, and a center 36a where two diagonal lines cross is eccentric to the side of the electron gun 17 housed in the electron gun housing portion 10. This X-ray tube 1E can also, like the X-ray tube 1A, take an enlarged perspective image by irradiating X-rays onto the circuit board B from an oblique direction, and can increase the magnification ratio of the enlarged perspective image. Also, the X-ray exit window 36 of the X-ray tube 1E crosses the tube axis C1, so that it is also possible to image the circuit board B from directly above.

Figure 13:
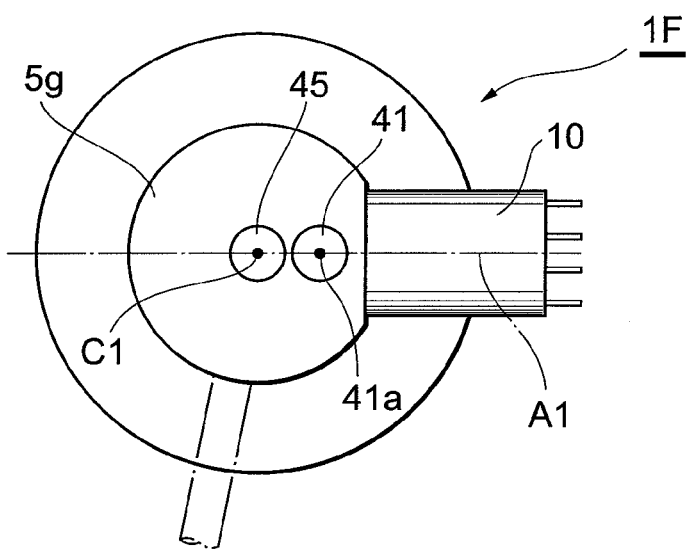
FIG. 13 show sixth to eighth embodiments of an X-ray tube according to the present invention, wherein (A) is a plan view of the X-ray tube according to the sixth embodiment observed from its X-ray exit window side, (B) is a plan view of the X-ray tube according to the seventh embodiment observed from its X-ray exit window side, and (C) is a plan view of the X-ray tube according to the eighth embodiment observed from its X-ray exit window side.
Figure 13:
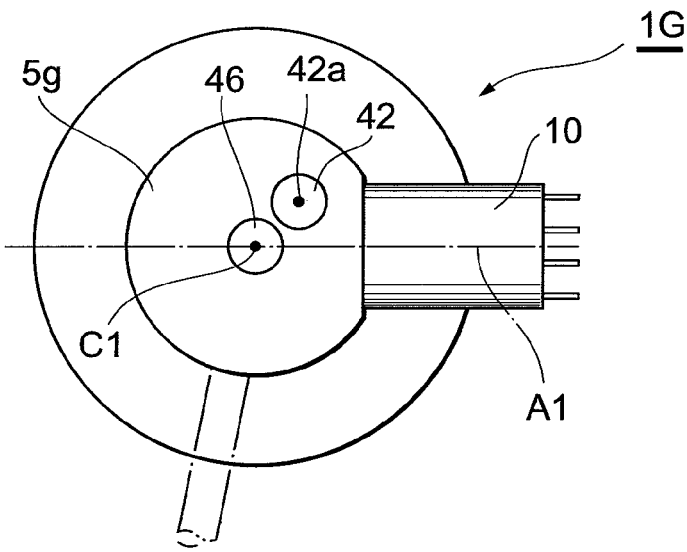
Figure 13:
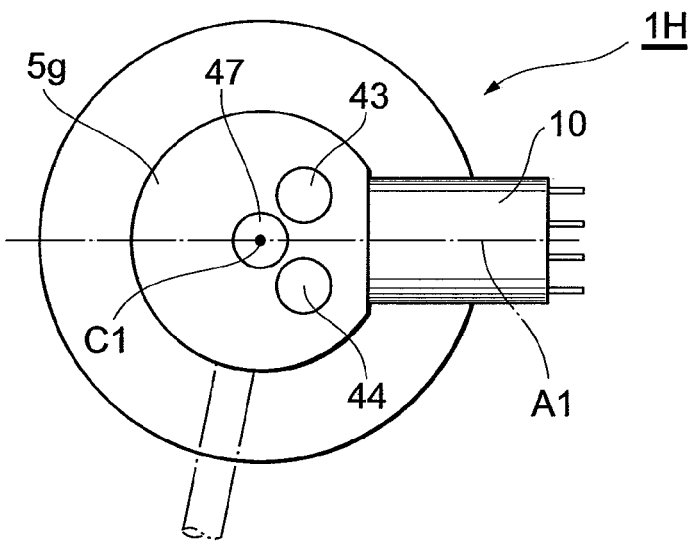

Next, referring to FIG. 13, description will be given of X-ray tubes 1F to 1H according to sixth to eight embodiments. Also, in the X-ray tubes 1F to 1H, the same or equivalent structures to those of the X-ray tube 1A are denoted with the same reference numerals and a description thereof will thus be omitted.

Sixth Embodiment

In the X-ray tube 1F, provided is an X-ray exit window 41 eccentric to the electron gun 17 side from the tube axis C1 and having a center 41a on the reference plane A1 and a central X-ray exit window 45 having a center on the tube axis C1 of the vacuum enclosure body 6. When the central X-ray exit window 45 is thus provided besides the X-ray exit window 41, the X-ray cameras 20 can be installed at a position tilted with respect to the tube axis C1 and at a position on the tube axis C1, respectively, so that besides imaging the circuit board B from an oblique direction, it also becomes possible to image the circuit board B from directly above by X-rays extracted through the central X-ray exit window 45. For example, it becomes possible to employ such an inspection method for imaging only a sample for which it is inferred that a re-inspection is necessary based on an enlarged perspective image taken from directly above, and thus the variation of the inspection method can be increased.

Seventh Embodiment

In the X-ray tube 1G, provided is an X-ray exit window 42 eccentric to the electron gun 17 side from the tube axis C1 and having a center 42a that is off to the side in a manner away from above the reference plane A1 and a central X-ray exit window 46 having a center on the tube axis C1 of the vacuum enclosure body 6. When the central X-ray exit window 46 is thus provided besides the X-ray exit window 42, the X-ray cameras 20 can be installed at a position tilted with respect to the tube axis C1 and at a position on the tube axis C1, respectively, so that besides imaging the circuit board B from an oblique direction, it also becomes possible to image the circuit board B from directly above by X-rays extracted through the central X-ray exit window 46. Further, the center 42a of the central X-ray exit window 46 is away from the electron gun 17 side, so that, without the electron gun housing portion 10 causing an obstruction, the circuit board B can be tilted to move close to the X-ray exit window 29.

Eighth Embodiment

Moreover, in the sealing portion 5g of an X-ray tube 1H, provided is a pair of X-ray exit windows 43 and 44 eccentric to the electron gun 17 side from the tube axis C1. These X-ray exit windows 43 and 44 are arranged so as to be symmetric with respect to the reference plane A1 containing the tube axis C1 and the tube axis C2 of the electron gun housing portion. Further, the X-ray tube 1H includes a central X-ray exit window 47 having a center on the tube axis C1 of the vacuum enclosure body 6. When the two X-ray exit windows 43 and 44 are thus provided, it becomes possible to take enlarged perspective images of the circuit board B from a plurality of different oblique directions, so that when an inspection of the circuit board B is performed, it becomes possible to take an enlarged perspective image from a more preferable direction.

Also, the number of X-ray exit windows 43 and 44 is not limited to two, and may be three or more.

Ninth Embodiment

Figure 14:
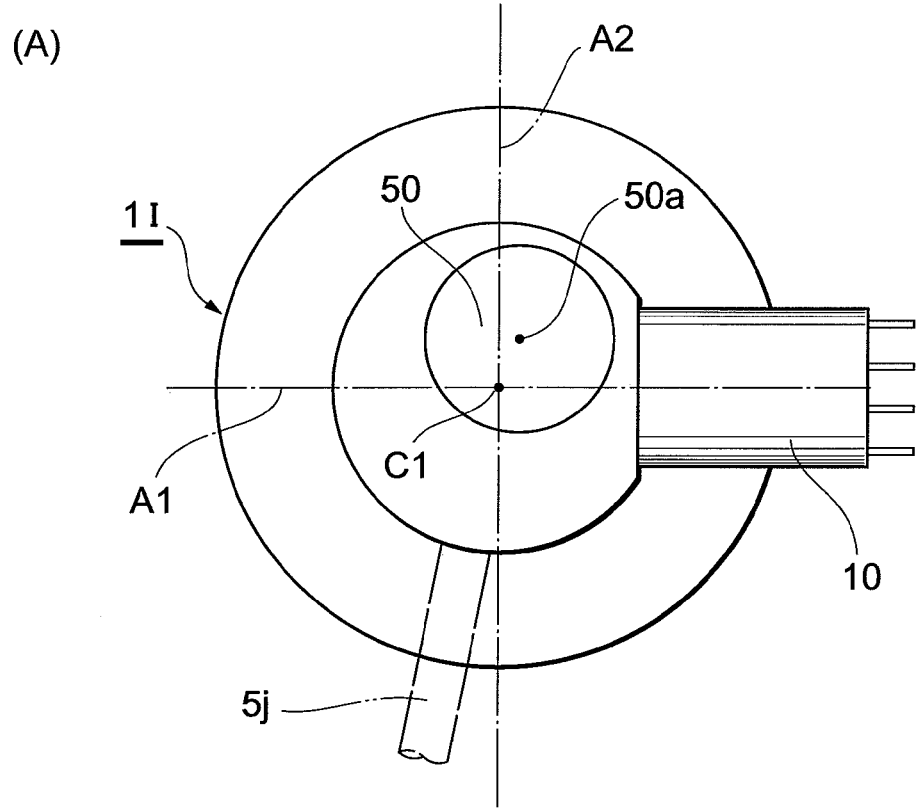
FIG. 14 show a ninth embodiment of an X-ray tube according to the present invention, wherein (A) is a plan view observed from its X-ray exit window side, and (B) is a back view observed from its electron gun side.
Figure 14:
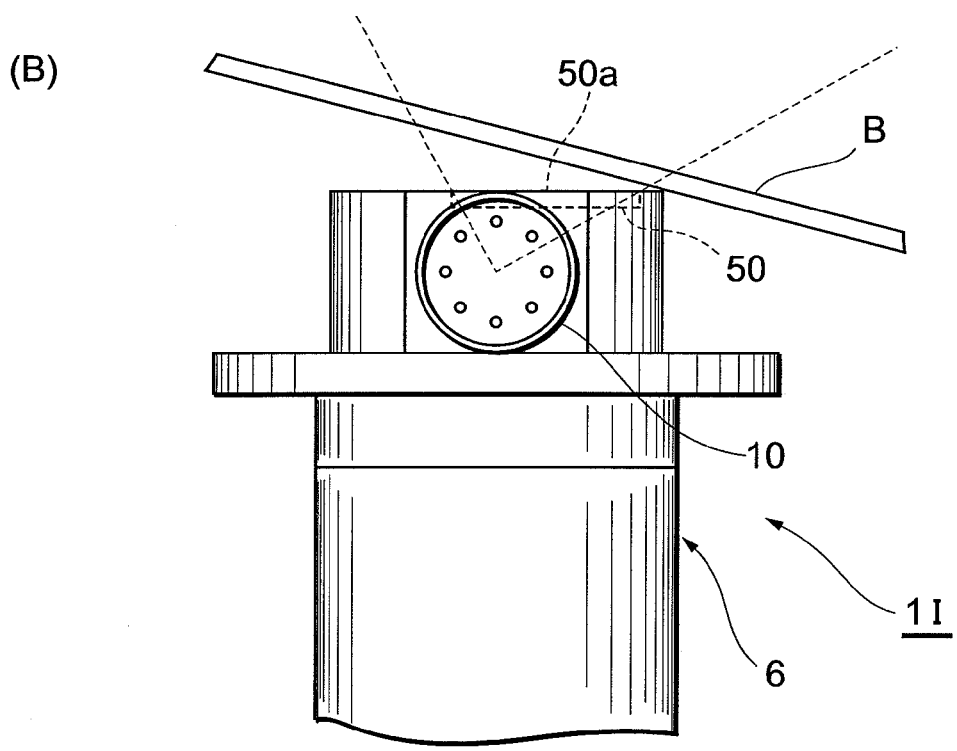

Referring to FIG. 14, description will be given of an X-ray tube 1I which is a ninth embodiment, and this X-ray tube 1I differs from the X-ray tube 1B according to the second embodiment in arrangement of an X-ray exit window 50. FIG. 14(A) is a plan view of the X-ray tube observed from its X-ray exit window side, and FIG. 14(B) is a side view of the X-ray tube observed from its electron gun housing portion side. Also, in the X-ray tube 1I according to the ninth embodiment, the same or equivalent structures to those of the X-ray tube 1A are denoted with the same reference numerals and a description thereof will thus be omitted.

As shown in FIG. 14(A), the X-ray exit window 50 has a circular shape and crosses the tube axis C1. Further, a center 50a of the X-ray exit window 50 is eccentric to the electron gun 17 side further than the plane A2 that passes through the tube axis C1 of the vacuum enclosure body 6 and is orthogonal to the reference plane A1. Further, the center 50a of the X-ray exit window 50 is off obliquely in a manner away from above the reference plane A1, besides the plane A2. When such a X-ray exit window 50 is provided, as shown in FIG. 14(B), the center 50a of the X-ray exit window 50 is off to the side away from the electron gun 17 side, so that, without the electron gun housing portion 10 causing an obstruction, the circuit board B can be tilted to move close to the X-ray exit window 50. As a result, in comparison with the X-ray tube 1A according to the first embodiment, the degree of freedom when tilting the circuit board B is increased, which makes it easy to move the circuit board B close to the X-ray exit window 29, so that the magnification ratio of an enlarged perspective image can be improved. Also, on the front-end portion 3b (see FIG. 3) of the X-ray tube 1I, formed is the slanted surface 3c in a manner facing the side of the electron gun 17, and in the slanted surface 3c, the disk-shaped target 9 is embedded. An electron incident surface of the target 9 is almost parallel to the slanted surface 3c, and for extracting X-rays generated at the electron incident surface in a direction tilted with respect to the tube axis C1, extraction is easier when the X-ray exit window 50 is eccentric to the electron gun 17 side. Moreover, for the X-ray tube 1I, in comparison with the X-ray tube 1B according to the second embodiment, since the center 50a of the X-ray exit window 50 is eccentric to the electron gun 17 side, it is easier to extract X-rays than for the X-ray tube 1B. Also, in the X-ray tube 1I, since the X-ray exit window 50 is arranged in a manner crossing the tube axis C1, besides imaging the circuit board B from an oblique direction, it is also possible to image the circuit board B from directly above by X-rays extracted through the X-ray exit window 50.

The present invention is not limited to the embodiments described above. For example, the material of the target 9 is not limited to tungsten, and another X-ray generating material may be used. In addition, the material of the X-ray exit window 18 is also not limited to the Be-material, and another desired material through which X-rays are easily transmitted may be used. Moreover, without being limited to the case where the target 9 in part of the anode 8, the anode 8 as a whole may be integrally formed of a desired X-ray generating material so that the anode 8 itself serves as a target. Further, the "housing" when the target is housed in the vacuum enclosure body (anode housing portion) 6 is not limited to the case of housing the target 9 as a whole, and examples may also include, when the anode 8 itself serves as a target, a state where part of the target is exposed from the vacuum enclosure body (anode housing portion) 6. The center of the aperture 10b, 33a is not limited to the case of being on the tube axis C2, C5 of the electron gun housing portion 10, 33, but such an arrangement of being other than on the tube axis C2, C5 may be employed. Moreover, the tubular vacuum enclosure body (anode housing portion) 6 is not limited to a circular tube shape, it may have a rectangular or another shape, and moreover, is not limited to a tube shape extending straight, it may have a curved or bent tube shape.

Figure 15:
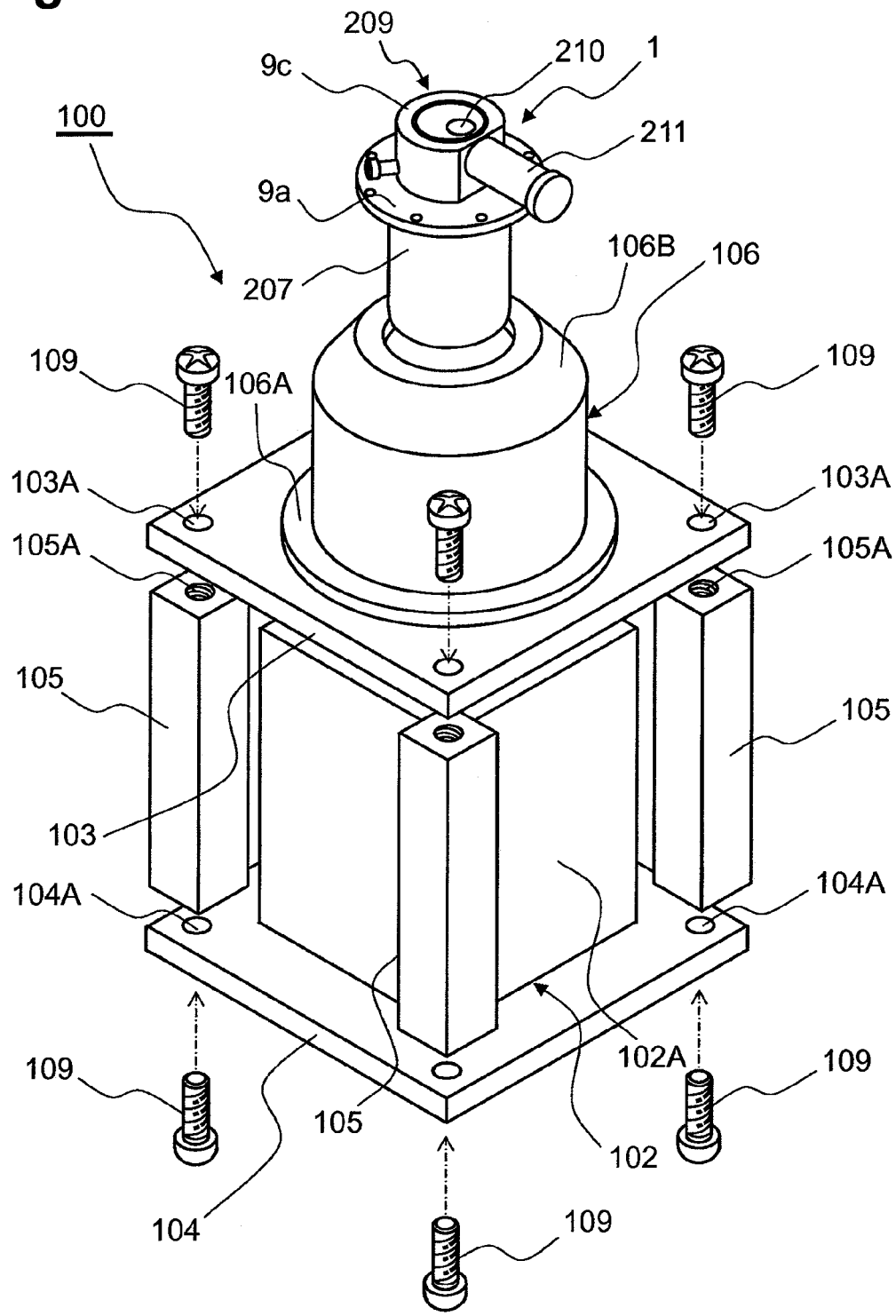
FIG. 15 is an exploded perspective view showing the configuration of an example of an X-ray source equipped with an X-ray tube according to the present invention.
Figure 16:
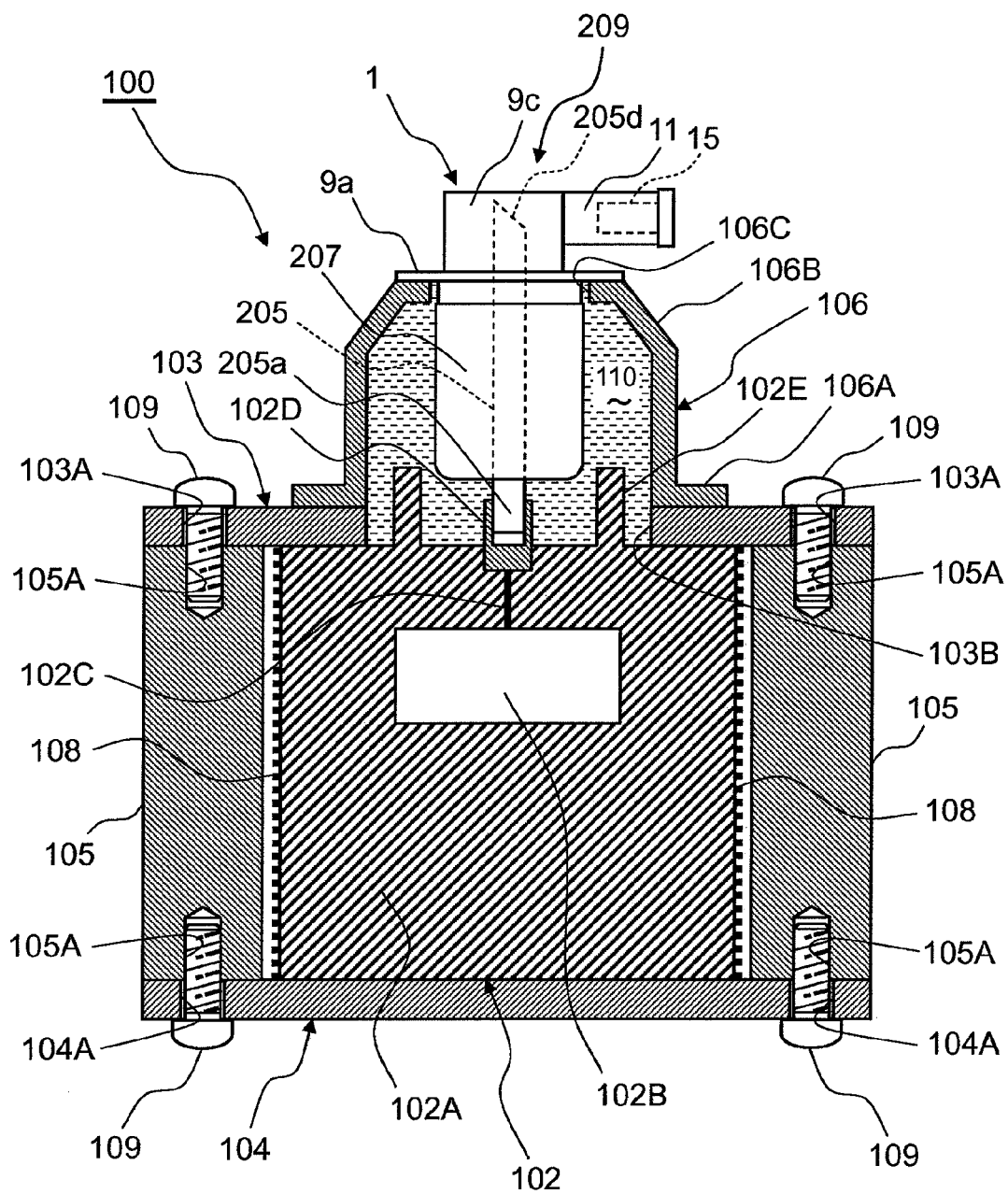
FIG. 16 is a sectional view showing an internal structure of the X-ray source according to the present example.

Next, an X-ray source 100 applied with the X-ray tube 1 will be described with reference to FIG. 15 and FIG. 16. FIG. 15 is an exploded perspective view showing the configuration of an example of an X-ray source equipped with an X-ray tube 1 according to the present invention. FIG. 16 is a sectional view showing an internal structure of the X-ray source according to the present example. Any one of the X-ray tubes 1A to 1I may be used in place of the X-ray tube 1.

As shown in FIG. 15 and FIG. 16, the X-ray source 100 includes a power supply portion 102, a first plate member 103 arranged on the upper surface side of an insulating block 102A, a second plate member 104 arranged on the lower surface side of the insulating block 102A, four fastening spacer members 105 interposed between the first plate member 103 and the second plate member 104, and an X-ray tube 1 fixed onto the first plate member 103 via a metallic cylinder member 106. Also, the power supply portion 102 has a structure with a high-voltage generating portion 102B, a high-voltage line 102C, a socket 102D, and the like (see FIG. 16) molded in the insulating block 102A made of an epoxy resin.

The insulating block 102A of the power supply portion 102 has a short-pillar shape whose almost square-shaped upper and lower surfaces are mutually parallel. At a center portion of the upper surface, arranged is the circular cylindrical socket 102D connected to the high-voltage generating portion 102B via the high-voltage line 102C. In addition, on the upper surface of the insulating block 102A, provided is an annular wall portion 102E arranged concentric with the socket 102D. Moreover, on a peripheral surface of the insulating block 102A, applied is a conductive paint 108 to provide its potential as a GND potential. Also, a conductive tape may be stuck in place of applying a conductive paint.

The first plate member 103 and the second plate member 104 are members that sandwich the insulating block 102A of the power supply portion 102 from upper and lower directions in the illustration in cooperation with, for example, the four fastening spacer members 105 and eight fastening screws 109. These first and second plate members 103 and 104 are formed in almost square shapes larger than the upper and lower surfaces of the insulating block 102A. At four corners of the first plate member 103 and the second plate member 104, respectively formed are screw insertion holes 103A and 104A through which the respective fastening screws 109 are inserted. Moreover, in the first plate member 103, formed is a circular opening 103B that surrounds the annular wall portion 102E provided in a protruding condition on the upper surface of the insulating block 102A.

The four fastening spacer members 105 are formed in pillar shapes and arranged at four corners of the first plate member 103 and the second plate member 104, respectively. The length of each fastening spacer member 105 is set slightly shorter than the interval between the upper surface and the lower surface of the insulating block 102A, that is, shorter by a tightening margin of the insulating block 102A. In the upper and lower end faces of each fastening spacer member 105, respectively formed are screw holes 105A into which the fastening screws 109 are screwed.

The metallic cylinder member 106 is formed in a circular cylindrical shape, and a flange 106A formed at a base-end portion thereof is fixed by screwing to the periphery of the opening 103B of the first plate member 103 via a sealing member. The peripheral surface of a front-end portion of this metallic cylinder member 106 is formed in a tapered surface 106B. Due to this tapered surface 106B, the metallic cylinder member 106 is formed in a tapered shape having no corner portion at its front-end portion. In a flat front end face continuous from the tapered surface 106B of the metallic cylinder member 106, formed is an opening 106C through which a valve 207 of the X-ray tube 1 is inserted.

The X-ray tube 1 includes a valve 207 that houses while holding an anode 205 in an insulating state, an upper portion 9c of a head portion 209 that houses a reflective target 205d which is conductive with the anode 205 and formed at an inner end portion thereof, and an electron gun housing portion 211 that houses an electron gun 15 which emits electron beams toward an electron incident surface (reflection surface) of the target 205d. Also, the valve 207 and the head portion 209 compose a target housing portion.

The valve 207 and the upper portion 9c of the head portion 209 are arranged so as to be coincident in tube axis, and a tube axis of an electron gun housing portion 11 is almost orthogonal to the tube axis of these. And, between the valve 207 and the upper portion 9c of the head portion 209, a flange 9a for fixing to the front-end portion of the metallic cylinder member 106 is formed. Moreover, a base-end portion 205a (a part applied with a high voltage by the power supply portion 102) of the anode 205 is protruded downward from a center portion of the valve 207 (see FIG. 16).

Also, the X-ray tube 1 is provided with an exhaust pipe as an adjunct, as a result of the interior of the valve 207, the upper portion 9c of the head portion 209, and the electron gun housing portion 11 being depressurized to a predetermined degree of vacuum via this exhaust pipe, a vacuum sealed container is formed.

In such an X-ray tube 1, the base-end portion 205a (high-voltage applying portion) is fitted with the socket 102D molded in the insulating block 102A of the power supply portion 102. This causes the base-end portion 205a to be supplied with a high voltage by the high-voltage generating portion 102B via the high-voltage line 102C. In addition, when the electron gun 15 built in the electron gun housing portion 11 emits electrons toward the electron incident surface of the target 205d in this state, X-rays that are generated as a result of the electrons from the electron gun 15 made incident into the target 205d are emitted through an X-ray exit window 210 mounted on the opening portion in the upper portion 9c of the head portion 209. The X-ray exit window 210 is eccentric to the electron gun 15 side with respect to the tube axis of the valve 207.

Here, the X-ray source 100 is assembled by, for example, the following procedure. First, the four fastening screws 109 inserted through the respective screw insertion holes 104A of the second plate member 104 are screwed into the respective screw holes 105A in the upper end faces of the four fastening spacer members 105, whereby the first plate member 103 and the second plate member 104 are mutually fastened in a manner supporting by grasping the insulating block 102A from the upper and lower directions. In such a case, a sealing member is interposed between the first plate member 103 and the upper surface of the insulating block 102A, and likewise, a sealing member is also interposed between the second plate member 104 and the lower surface of the insulating block 102A.

Next, through the opening 106C of the metallic cylinder member 106 fixed onto the first plate member 103, a high-voltage insulating oil 110, which is a liquid insulating material, is poured into the metallic cylinder member 106. Then, the valve 207 of the X-ray tube 1 is inserted, through the opening 106C of the metallic cylinder member 106, inside the metallic cylinder member 106 and is immersed in the high-voltage insulating oil 110. At this time, the base-end portion 205a (high-voltage applying portion) protruded downward from the center portion of the valve 207 is fitted with the socket 102D on the power supply portion 102 side. Then, the flange 9a of the X-ray tube 1 is fixed by screwing to the front-end face of the metallic cylinder member 106 via a sealing member.

In the X-ray source 100 assembled through such steps as in the above, as shown in FIG. 16, with respect to the anode 205 in the X-ray tube 1, the annular wall portion 102E provided in a protruding condition on the upper surface of the insulating block 102A and the metallic cylinder member 106 are concentrically arranged. In addition, the annular wall portion 102E is protruded at a height to surround the base-end portion 205a (high-voltage applying portion) protruded from the valve 207 of the X-ray tube 1 so as to shield a gap with the metallic cylinder member 106.

In the X-ray source 100, when a high voltage is applied from the high-voltage generating portion 102B of the power supply portion 102 to the base-end portion 205a of the X-ray tube 1 via the high-voltage line 102C and the socket 102D, a high voltage is supplied to the target 205d via the anode 205. When the electron gun 15 housed in the electron gun housing portion 11 emits, in this state, electrons toward the electron incident surface of the target 205d housed in the upper portion 9c of the head portion 209, the electrons are made incident into the target 205d. As a result, X-rays that are generated at the target 205d are emitted outside via the X-ray exit window 210 mounted on the opening portion in the upper portion 9c of the head portion 209.

Here, in the X-ray source 100, the metallic cylinder member 106 that houses the valve 207 of the X-ray tube 1 in a state immersed in the high-voltage insulating oil 110 is fixed while being provided in a protruding condition outside the insulating block 102A of the power supply portion 102, that is, on the first plate member 103. Therefore, heat radiation performance is excellent, and heat radiation of the high-voltage insulating oil 110 within the metallic cylinder member 106 and the valve 207 of the X-ray tube 1 can be promoted.

Moreover, the metallic cylinder member 106 has a circular cylindrical shape with the anode 205 arranged at the center. In this case, the distance from the anode 205 to the metallic cylinder member 106 is equalized, and thus electric fields formed around the anode 205 and the target 205d can be stabilized. Then, the metallic cylinder member 106 can make the charged high-voltage insulating oil 110 effectively discharge.

Further, the annular wall portion 102E provided in a protruding condition on the upper surface of the insulating block 102A of the power supply portion 102 surrounds the base-end portion 205a (high-voltage applying portion) protruded from the valve 207 of the X-ray tube 1 and thereby shields a gap with the metallic cylinder member 106. Consequently, an abnormal discharge from the base-end portion 205a to the metallic cylinder member 106 can be effectively prevented.

Meanwhile, the X-ray source 100 has a structure such that the insulating block 102A of the power supply portion 102 is supported by grasping between the first plate member 103 and the second plate member 104 mutually fastened via the four fastening spacer members 105. This means that no conductive foreign matter that induces discharge or charged foreign matter that induces an electric field disturbance exists in the insulating block 102A. Therefore, according to the X-ray source 100, a useless discharge phenomenon or electric field disturbance in the power supply portion 102 is effectively suppressed.

Figure 17:
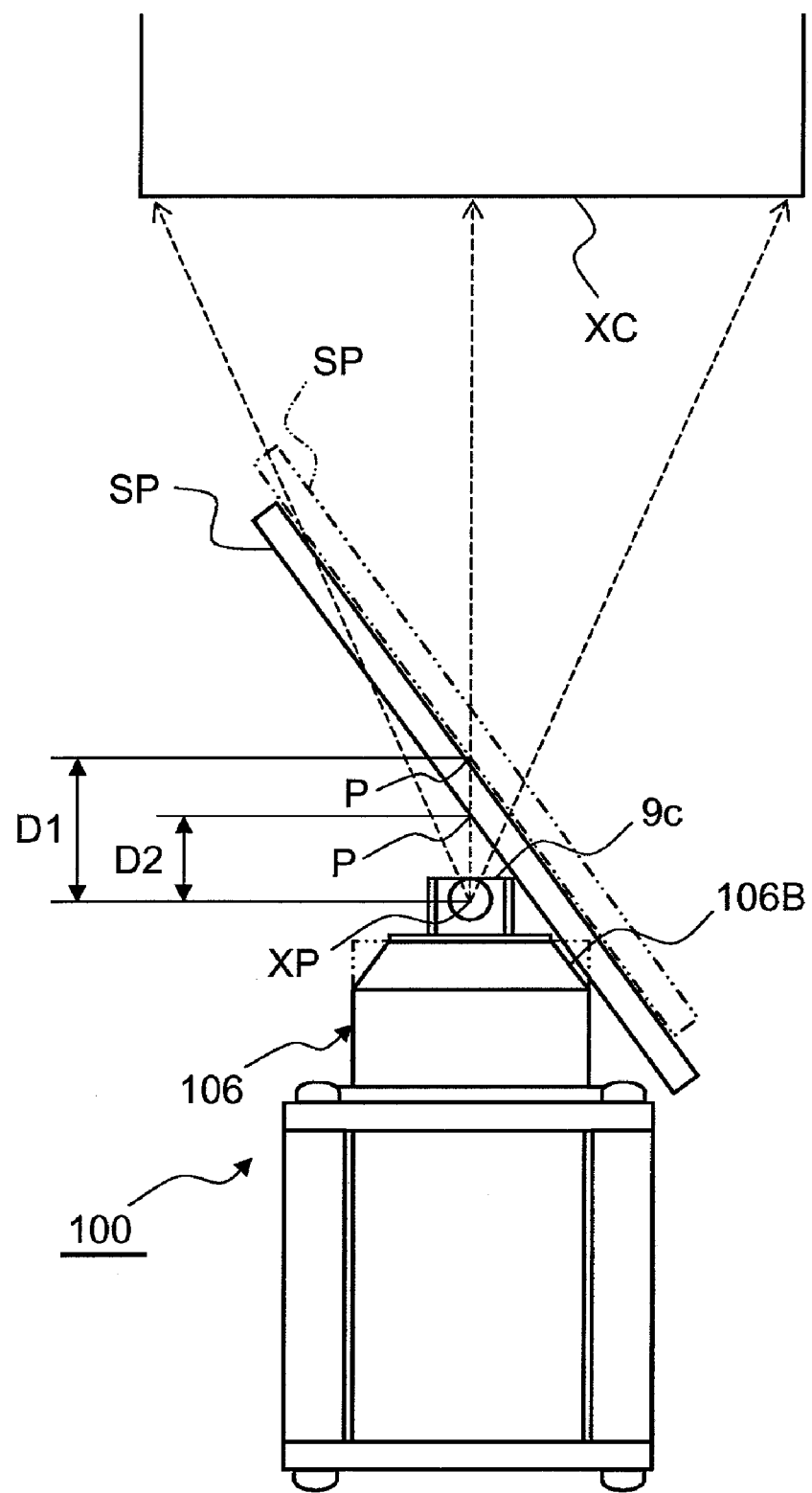
FIG. 17 is a front view for explaining actions of an X-ray source (including the X-ray tube according to the present example) incorporated in an X-ray generator of a nondestructive inspection system.

Here, the X-ray source 100 is used, for example, in a nondestructive inspection system for observing an internal structure of a sample as a perspective image, in a manner incorporated in an X-ray generator that irradiates X-rays onto the sample. FIG. 17 is a front view for explaining, as a usage example of said X-ray source 100, actions of an X-ray source (including the X-ray tube according to the present example) incorporated in an X-ray generator of a nondestructive inspection system.

The X-ray source 100 irradiates X-rays toward a sample plate SP arranged between the same and an X-ray camera XC. More specifically, the X-ray source 100 irradiates X-rays, from an X-ray generating point XP of the target 205d built in the upper portion 9c of the head portion 209 protruded upward of the metallic cylinder member 106, onto the sample plate SP, through the X-ray exit window 210.

In such a usage example, the closer the distance from the X-ray generating point XP to the sample plate SP, the larger the magnification ratio of a perspective image of the sample plate SP by the X-ray camera XC becomes, so that the sample plate SP is usually arranged in proximity to the X-ray generating point XP. Moreover, when the internal structure of the sample plate SP is three-dimensionally observed, the sample plate SP is tilted around an axis orthogonal to the X-ray irradiating direction.

Here, as shown in FIG. 17, when approximating an observing point P of the sample plate SP to the X-ray generating point XP for a three-dimensional observation with the sample plate SP being tilted around an axis orthogonal to the X-ray irradiating direction, if such a corner portion as shown by alternate long and two short dashed lines remains at the front-end portion of the metallic cylinder member 106 of the X-ray source 100, the observing point P of the sample plate SP can be approximated to the X-ray generating point XP only up to a distance where the sample plate SP contacts the front-end corner portion of the metallic cylinder member 106, that is, a distance where the distance from the X-ray generating point XP to the observing point P equals D1.

On the other hand, in the X-ray source 100 where the front-end portion of the metallic cylinder member 106 is formed in a tapered shape having no corner portion due to the tapered surface 106B as shown in FIG. 15 and FIG. 16, the observing point P of the sample plate SP can be approximated to the X-ray generating point XP up to a distance where the sample plate SP contacts the tapered surface 106B of the metallic cylinder member 106, that is, a distance where the distance from the X-ray generating point XP to the observing point P equals D2. As a result, it becomes possible to enlarge a perspective image of the observing point P of the sample plate SP larger and perform a nondestructive inspection of the observing point P more precisely.

The X-ray source 100 is by no means limited to the example described above. For example, for the metallic cylinder member 106, it is preferable that the sectional shape of an inner circumferential surface thereof is circular, however, the sectional shape of an outer circumferential surface thereof is not limited to a circular shape, and can be a quadrangular or another polygonal shape. In this case, the peripheral surface of the front-end portion of the metallic cylinder member can be formed in a slope form.

Moreover, the insulating block 102A of the power supply portion 102 may have a short columnar shape, and the first plate member 103 and the second plate member 104 may have disk shapes corresponding thereto. Further, the fastening spacer members 105 may be in columnar shapes, and the number thereof is also not limited to four.

The invention claimed is:

1. An X-ray tube comprising:
    a tubular anode housing portion;
    an anode arranged in the anode housing portion; and
    an X-ray exit window through which X-rays are extracted, the X-rays being generated by making electrons emitted from an electron gun incident into a target of the anode; wherein
    the anode is arranged along a tube axis of the anode housing portion, and
    in a sealing portion provided at an end portion of the anode housing portion, provided is the X-ray exit window, a center of the X-ray exit window is eccentric with respect to the tube axis of the anode housing portion.

2. The X-ray tube according to claim 1, wherein the electron gun is attached to a peripheral wall provided around the tube axis of the anode housing portion, and the X-ray exit window is eccentric to the electron gun side with respect to the tube axis.

3. The X-ray tube according to claim 2, wherein
    the electron gun is housed in a tubular electron gun housing portion fixed to the anode housing portion,
    a tube axis of the electron gun housing portion is orthogonal to the tube axis of the anode housing portion, and
    the X-ray exit window has a center at a position off a plane containing the tube axis of the anode housing portion and the tube axis of the electron gun housing portion.

4. The X-ray tube according to claim 1, wherein the X-ray exit window is provided in plurality in the sealing portion.

5. The X-ray tube according to claim 1, wherein
    the electron gun is housed in a tubular electron gun housing portion fixed to the anode housing portion,
    a tube axis of the electron gun housing portion and the tube axis of the anode housing portion cross each other, and an included angle formed by the tube axis of the electron gun housing portion and the tube axis of the anode housing portion is an acute angle, and
    the X-ray exit window has a center on a plane containing the tube axis of the anode housing portion and the tube axis of the electron gun housing portion.

6. The X-ray tube according to claim 1, wherein
    in the sealing portion, provided is the X-ray exit window provided eccentric with respect to the tube axis of the anode housing portion and a central X-ray exit window having a center on the tube axis of the anode housing portion.

7. A nondestructive inspection system comprising:
    an X-ray tube that makes electrons emitted from an electron gun incident into a target of an anode arranged in a tubular anode housing portion to generate X-rays, and extracts the X-rays through an X-ray exit window; and
    an X-ray imaging device that images the X-rays extracted from the X-ray tube and transmitted through a sample, wherein
    the target is arranged on a tube axis of the anode housing portion, and
    in a sealing portion provided at an end portion of the anode housing portion, provided is the X-ray exit window, a center of the X-ray exit window is eccentric with respect to the tube axis of the anode housing portion.

* * * * *